(12) United States Patent
Kawaguchi et al.

(10) Patent No.: US 7,298,066 B2
(45) Date of Patent: Nov. 20, 2007

(54) DRIVE APPARATUS FOR PIEZOELECTRIC ACTUATOR, DRIVE METHOD FOR PIEZOELECTRIC ACTUATOR, ELECTRONIC DEVICE, CONTROL PROGRAM FOR DRIVE APPARATUS FOR PIEZOELECTRIC ACTUATOR, AND RECORDING MEDIUM

(75) Inventors: Takashi Kawaguchi, Shiojiri (JP); Akihiro Sawada, Matsumoto (JP); Yutaka Yamazaki, Suwa (JP); Makoto Okeya, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/269,682

(22) Filed: Nov. 9, 2005

(65) Prior Publication Data

US 2006/0113863 A1 Jun. 1, 2006

(30) Foreign Application Priority Data

Nov. 9, 2004 (JP) ............................. 2004-325366

(51) Int. Cl.
*H01L 41/08* (2006.01)
(52) U.S. Cl. ..................... 310/316.01; 310/316.02; 310/323.02
(58) Field of Classification Search ........... 310/316.01, 310/316.02, 317, 319
See application file for complete search history.

(56) References Cited

U.S. PATENT DOCUMENTS 4,025,875 A * 5/1977 Fletcher et al. ............... 372/30

6,376,965 B1 * 4/2002 Kataoka et al. ............. 310/317
6,429,571 B2 * 8/2002 Raffalt et al. .......... 310/316.01
7,116,033 B2 * 10/2006 Seki et al. ................... 310/317

FOREIGN PATENT DOCUMENTS

JP 2002-291264 A 10/2002

* cited by examiner

*Primary Examiner*—Mark Budd
(74) *Attorney, Agent, or Firm*—Global IP Counselors, LLP

(57) ABSTRACT

A drive apparatus for a piezoelectric actuator prevents locking drive frequency in a state of resonance due to harmonics. There is no need to provide external components to filter, and circuitry can easily be reduced in size. The drive apparatus has a phase difference-DC conversion circuit to detect vibrating state of the vibrating body, a comparison circuit, a harmonics detection circuit to detect that the vibrating body is resonating due to harmonics and outputting a harmonics detection signal, an integration circuit to control the frequency of the drive signal supplied to the piezoelectric element of the vibrating body, a variable frequency oscillation circuit, and a drive circuit. The integration circuit, the variable frequency oscillation circuit, and the drive circuit control the frequency of the drive signal on the basis of the output of the comparison circuit when a harmonics detection signal is not outputted and continue to vary the frequency of the drive signal without controlling the frequency of the drive signal on the basis of the output of the comparison circuit when a harmonics detection signal is being outputted.

23 Claims, 19 Drawing Sheets

DRIVE APPARATUS FOR PIEZOELECTRIC ACTUATOR, DRIVE METHOD FOR PIEZOELECTRIC ACTUATOR, ELECTRONIC DEVICE, CONTROL PROGRAM FOR DRIVE APPARATUS FOR PIEZOELECTRIC ACTUATOR, AND RECORDING MEDIUM

TECHNICAL FIELD

The present invention relates to a drive apparatus for a piezoelectric actuator that includes a vibrating body having a piezoelectric element, a drive method for a piezoelectric actuator, an electronic device, a control program for a drive apparatus for a piezoelectric actuator, and a recording medium.

BACKGROUND TECHNOLOGY

Piezoelectric elements have an excellent conversion ratio of electrical energy to mechanical energy, and excellent responsiveness. Various piezoelectric actuators that utilize the piezoelectric effects of piezoelectric elements have therefore been recently under development.

These piezoelectric actuators have as their primary constituent element a vibrating body having a piezoelectric element, wherein the vibrating body is composed of, for example, a plate-shaped reinforcing plate having a protrusion that is in contact with a driven body at one end, piezoelectric elements affixed to both surfaces of the reinforcing plate, drive electrodes provided on the surfaces of these piezoelectric elements, and detection electrodes that are electrically insulated from the drive electrodes. A drive apparatus for a piezoelectric actuator is also known whereby a prescribed alternating current is applied to the drive electrodes of the vibrating body, the vibrating body is excited by longitudinal vibration that causes it to expand and contract in the longitudinal direction, and flexural vibration is induced whereby the vibrating body oscillates in the direction orthogonal to the direction of the longitudinal vibration (see Prior Art 1, for example).

With the drive control performed by this type of drive apparatus, a piezoelectric actuator rotates so that the protrusion of the vibrating body traces an elliptical orbit, and drives the driven body that is in contact with the protrusion. An alternating current voltage having the optimum oscillation frequency according to design must be applied to the vibrating body of the piezoelectric actuator, and the prescribed longitudinal vibration and flexural vibration must be generated therein in order for the driven body to be driven at high efficiency. However, due to the individual differences in the piezoelectric actuators, their temperature characteristics, load characteristics, and the like, it is difficult to continually apply the optimum drive frequency for which the apparatus is designed. Feedback control is therefore implemented in this drive apparatus whereby a detection signal from the detection electrodes provided to the piezoelectric elements is detected, and the drive frequency of the alternating current voltage applied to the drive electrodes is adjusted based on the detection signal.

Specifically, drive apparatuses are known that utilize the fact that the phase difference between the phase of the alternating current voltage applied to the drive electrodes and the phase of the detection signal detected from the detection electrodes, or the phase difference among the detection signals detected from a plurality of detection electrodes, is dependent upon the drive frequency of the alternating current voltage applied to the drive electrodes.

The drive apparatus of this piezoelectric actuator includes a waveform shaping circuit, a phase difference-DC conversion circuit, a comparison circuit, an integration circuit, a variable frequency oscillating circuit, and a drive circuit, as shown in FIG. 19.

The waveforms of a drive signal SDR outputted from the drive circuit and a detection signal SD1 detected from a detection electrode of the piezoelectric actuator are shaped by the waveform shaping circuit, the phase difference in these signals is detected by the phase difference-DC conversion circuit, the detected phase difference is compared with a target phase difference by the comparison circuit, and the comparison information is integrated by the integration circuit and outputted to the variable frequency oscillating circuit.

The variable frequency oscillating circuit oscillates at a frequency corresponding to the comparison information from the integration circuit and outputs a frequency signal to the drive circuit, and a drive signal corresponding to the frequency is outputted from the drive circuit to a vibrating body.

Therefore, in the drive apparatus of the piezoelectric actuator, the drive frequency of the alternating current voltage applied to the drive electrode is adjusted so that the phase difference detected by the phase difference-DC conversion circuit nears a preset reference phase difference. As a result of implementing such feedback control, an alternating current voltage having the optimum drive frequency can be applied to the vibrating body of the piezoelectric actuator, the piezoelectric actuator can be excited at prescribed longitudinal and flexural vibrations, and the driven body can be driven with high efficiency.

[Prior Art 1] Japanese Patent Application Laid-Open No. 2002-291264 (FIG. 26)

SUMMARY OF THE INVENTION

Problems that the Invention is to Solve

In addition to the drive frequency (resonance point) f1 at which the piezoelectric actuator is most effectively driven in terms of design, as shown by the impedance characteristics in relation to the drive frequency in FIG. 6, the piezoelectric actuator has sometimes exhibited a resonance point f2, depending on its shape and other factors.

When a rectangular wave that allows the drive circuit to be simplified and the actuator to be driven at low voltage is used as the drive signal, the actuator may resonate due to a harmonic component that is three times the frequency of the rectangular wave, when the drive frequency of the piezoelectric actuator is an odd-number fraction (⅓, for example) of f2. The relationship between the drive waveform and the detection waveform at that time is as shown in FIG. 8, for example. Specifically, the vibrating body 910 mechanically vibrates due to the threefold harmonic component even when the drive frequency is ⅓ of f2 (f2/3), and a detection waveform with three times the frequency is therefore outputted.

For this reason, there are drawbacks in that the phase difference detection circuit for controlling the frequency malfunctions, the system locks on a frequency (for example, f2/3) that is different than the original optimum drive frequency (a state in which the frequency is repeatedly increased and decreased in an alternating fashion), and the piezoelectric actuator does not operate.

In order to resolve such problems, it is possible to consider a method in which a filter is inserted into the drive circuit or the detection circuit, but there are drawbacks in such cases in that the number of analog elements and other external components increases, the circuits increase in size, and costs are higher. There are also problems when the detection signal is filtered in that the power for driving the filter is attenuated.

An object of the present invention is to provide a drive apparatus for a piezoelectric actuator, a drive method for a piezoelectric actuator, an electronic device, a control program for a drive apparatus for a piezoelectric actuator, and a recording medium, wherein when the drive frequency of the piezoelectric actuator is controlled, the drive frequency can be prevented from being locked in a state of resonance due to harmonics, external components and the like are not required, and the circuits can easily be made smaller Means of Solving the Problems The present invention is a drive apparatus for a piezoelectric actuator wherein a drive signal is supplied to a piezoelectric element, and the piezoelectric actuator has a vibrating body vibrated by applying a drive signal having a specific frequency to the piezoelectric element, and a contact section that is provided to the vibrating body and that is in contact with the drive object; the drive apparatus for a piezoelectric actuator having a vibrating state detection device for detecting the vibrating state of the vibrating body, a harmonics detection device for detecting that the vibrating body is resonating due to the harmonics of the drive signal and outputting a harmonics detection signal, and a frequency control device for controlling the frequency of the drive signal supplied to the piezoelectric element; wherein the frequency control device controls the frequency of the drive signal supplied to the piezoelectric element on the basis of the detection signal outputted from the vibrating state detection device when a harmonics signal is not outputted, and continues to vary the frequency of the drive signal without controlling the frequency of the drive signal on the basis of the detection signal outputted from the vibrating state detection device while the harmonics detection signal is being outputted.

In the present invention, since a harmonics detection device is provided for outputting a harmonics detection signal when the vibrating body is resonating due to the harmonics of the drive signal, and the frequency of the drive signal continues to be varied irrespective of the results of the vibrating state detection device while the harmonics detection signal is being outputted, the frequency of the drive signal can be reliably isolated from the frequency of resonance due to the harmonics. Therefore, when the frequency of the drive signal is controlled by the frequency control device, it is not locked at the frequency of resonance due to the harmonics, and it is possible to reliably prevent the problem in which the piezoelectric actuator is not driven.

Also, since the harmonics detection device is provided and controlled, the need for filter coils and other such external components can be eliminated, and the circuits can be made smaller and can be easily integrated.

Furthermore, providing a filter to the input of the detection signal affects the detection characteristics, but there is no need to provide a filter in the present invention and the effects on the detection characteristics can therefore be eliminated.

Also, when a filter is provided to the output of the drive signal, the output is attenuated and the drive efficiency decreases, but since a filter does not need to be provided to the output of the drive signal in the present invention, and output attenuation can be prevented and the drive efficiency can be improved.

In the present invention, the vibrating state detection device preferably detects at least one characteristics value from among the phase difference characteristics, the amplitude characteristics, and the electric current characteristics of the detection signal of the piezoelectric actuator, and outputs a first detection signal if the characteristics value is equal to or greater than a preset target value, or outputs a second signal if the characteristics value is less than a preset target value; the frequency control device is set to be capable of varying the frequency of the drive signal within a specific range, and varies the frequency from one of either the maximum frequency or the minimum frequency of the range in a first direction towards the other; the frequency is varied while the direction in which the frequency is varied is maintained in the first direction when a harmonics detection signal is not outputted and one of the first detection signal or the second detection signal is outputted; the frequency is varied while the direction in which the frequency is varied is changed to the second direction opposite the first direction when the a harmonics detection signal is not outputted and the other of the first detection signal or the second detection signal is outputted; and the frequency is varied while the direction in which the frequency is varied is maintained in the first direction when the harmonics detection signal is outputted.

In the present invention, the frequency of the drive signal is swept (varied) within a specific range, and the piezoelectric actuator can therefore be reliably driven even when the resonance frequency of the piezoelectric actuator fluctuates due to the surrounding temperature, the load, and other effects.

Also, the frequency control device can be easily controlled because the direction in which the frequency is varied needs only to be switched based on the detection results of the vibrating state detection device or the harmonics detection device.

In the present invention, it is preferable that the harmonics detection device outputs a harmonics detection signal when the detection signal both rises and falls within half a cycle of the drive signal.

Normally, the detection signal has a specific phase difference with the drive signal and has substantially the same frequency. Therefore, the detection signal either only rises or only falls within half a cycle of the drive signal.

Accordingly, in a state of resonance due to harmonics, the detection signal has a higher frequency (three times the frequency, for example) than the drive signal due to harmonic components, and the detection signal both rises and falls within half a cycle of the drive signal. Therefore, a state of resonance due to harmonics can be easily detected by using the harmonics detection device for detecting such a state of resonance.

In the present invention, the harmonics detection device may be designed to output a harmonics detection signal when the detection signal rises or falls a plurality of times within half a cycle of the drive signal.

In a state of resonance due to harmonics, the detection signal has a higher frequency (three times the frequency, for example) than the drive signal due to harmonic components, and the detection signal therefore rises a plurality of times and also falls a plurality of times within half a cycle of the drive signal. Therefore, a state of resonance due to harmonics can be easily detected by using the harmonics detection device for detecting such a state.

Also, a harmonics detection device that detects whether the detection signal rises or falls a plurality of times within half a cycle of the drive signal can have simpler circuitry and can reduce the possibility that the fundamental wave of the detection signal will be erroneously detected as harmonics when the phase difference between the drive signal and the detection signal is small in comparison with a harmonics detection device that detects whether the detection signal both rises and falls.

Conversely, a harmonics detection device that detects whether the detection signal both rises and falls within half a cycle of the drive signal can reduce the possibility that the harmonics of the detection signal will be erroneously detected as a fundamental wave when the phase difference between the drive signal and the detection signal is small in comparison with a harmonics detection device that detects whether the detection signal rises or falls a plurality of times.

In the present invention, the harmonics detection device may be designed to output a harmonics detection signal when the detection signal rises or falls n+1 number of times or more within n cycles of the drive signal.

For example, with the harmonics detection device of the present invention, a harmonics detection signal is outputted when the detection signal rises or falls 4 (n+1) or more times within 3 (n) cycles of the drive signal when n=3, wherein n is an integer of 1 or greater.

As previously described, normally the drive signal and the detection signal have the same frequency, and the detection signal therefore either rises or falls n times within n cycles of the drive signal. Therefore, if this number is n+1 or greater, it is possible to determine that a state of resonance due to harmonics has occurred, and the state of resonance due to harmonics can be easily detected by using the harmonics detection device for detecting such a state.

Also, since a state of resonance due to harmonics is detected by the number of times the detection signal rises or otherwise varies within n cycles, the possibility that the harmonics will be erroneously detected as a fundamental wave can be reduced in comparison with the case in which they are determined within half a cycle of the drive signal, even when the components of the fundamental wave in the detected waveform are large and zero crossings due to harmonics are not likely to occur.

In the present invention, the harmonics detection device may be designed to output a harmonics detection signal when the frequency of the drive signal and the frequency of the detection signal do not match.

Matching between the frequencies of the drive signal and the detection signal is not limited to when the signals are completely identical, but also includes cases in which the signals have a slight difference and can be considered to be a match. Specifically, the harmonics detection device of the present invention may be designed to output a harmonics detection signal if the difference between the frequencies of the drive signal and the detection signal is within a specific range.

As previously described, the drive signal and the detection signal ordinarily have the same frequency, and therefore if the frequencies of the signals do not match, it is possible to determine that a state of resonance due to harmonics has occurred, and the state of resonance due to harmonics can be easily detected by using the harmonics detection device for detecting such a state.

Also, the harmonics detection device of the present invention does not need to make any determinations within half a cycle of the drive signal, and therefore the possibility that the harmonics will be erroneously detected as a fundamental wave can be reduced even when the fundamental wave in the detected waveform has large components and zero crossings due to harmonics are not likely to occur.

In the present invention, the harmonics detection device may be designed to output a harmonics detection signal when the frequency of the detection signal is greater than the frequency of the drive signal.

As previously described, the drive signal and the detection signal ordinarily have the same frequency, and the frequency of the detection signal increases when there is a state of resonance due to harmonics. Therefore, when the frequency of the detection signal is greater than the frequency of the drive signal, it is possible to determine that a state of resonance due to harmonics has occurred, and the state of resonance due to harmonics can be easily detected by using the harmonics detection device for detecting such a state.

Also, the harmonics detection device of the present invention is not required to make any determinations within half a cycle of the drive signal, and therefore the possibility that the harmonics will be erroneously detected as a fundamental wave can be reduced even when the fundamental wave in the detected waveform has large components and zero crossings due to harmonics are not likely to occur.

The frequency control device preferably has a frequency-change-rate change device for varying the rate of change in drive frequency, which is the amount of change in drive frequency per unit time, and the frequency-change-rate change device increases the rate of change in frequency to be greater when a harmonics detection signal is outputted in comparison with the case in which a harmonics detection signal is not outputted.

For example, the frequency-change-rate change device is set to be capable of varying the rate of change in drive frequency between two speeds: a low speed and a high speed. The device may be set to a high speed when a harmonics detection signal is outputted, and may be set to a low speed when a harmonics detection signal is not outputted.

According to such a configuration, since the rate of change in frequency is increased by the frequency-change-rate change device while the harmonics detection signal is being outputted, it is possible to quickly pass through frequency regions in which the rate at which the drive frequency changes increases and a state of resonance due to harmonics occurs, and the control time until the drive frequency is locked at the target frequency can be shortened by a corresponding amount of time.

In this case, an amplitude detection device is preferably provided for detecting when the amplitude of the detection signal is equal to or greater than a specific value and outputting an amplitude detection signal, and the frequency-change-rate change device reduces the rate of change in frequency when a harmonics detection signal is not outputted, to be less when an amplitude detection signal is outputted than when a harmonics detection signal is outputted.

If the frequency-change-rate change device is set to be capable of varying the rate of change in drive frequency between two speeds: a low speed and a high speed, the device may be set to a high speed when a harmonics detection signal is outputted and set to a low speed in other cases.

Also, in the case that the frequency-change-rate change device is set to be capable of varying the rate of change in drive frequency between three speeds: a low speed, a medium speed, and a high speed, the device may be set to a high speed when a harmonics detection signal is outputted, to a medium speed when a harmonics detection and an amplitude detection signal are not outputted, and to a low speed when a harmonics detection signal is not outputted and an amplitude detection signal is outputted.

According to such a configuration, the rate of change in frequency is reduced by the frequency-change-rate change device when a harmonics detection signal is not outputted and an amplitude detection signal is outputted, and the speed at which the drive frequency changes can thereby be reduced. Therefore, in order to increase the speed at which the drive frequency changes, the drive frequency can be reliably locked at a specific frequency without passing by the target drive frequency.

The drive method for a piezoelectric actuator of the present invention is a drive method for a piezoelectric actuator wherein a drive signal is supplied to a piezoelectric element, and the piezoelectric actuator has a vibrating body vibrated by applying a drive signal having a specific frequency to the piezoelectric element, and a contact section that is provided to the vibrating body and that is in contact with the drive object; the drive method for a piezoelectric actuator having a vibrating state detection step for detecting the vibrating state of the vibrating body, a harmonics detection step for detecting that the vibrating body is resonating due to the harmonics of the drive signal and outputting a harmonics detection signal, and a frequency control step for controlling the frequency of the drive signal supplied to the piezoelectric element; wherein the frequency control step controls the frequency of the drive signal supplied to the piezoelectric element on the basis of the detection signal outputted in the vibrating state detection step when a harmonics detection signal is not outputted, and continues to vary the frequency of the drive signal without controlling the frequency of the drive signal on the basis of the detection signal outputted in the vibrating state detection step while the harmonics detection signal is being outputted.

Since a vibrating state detection step, a harmonics detections step, and a frequency control step are provided in accordance with such a drive method for a piezoelectric actuator, the same operational effects as in the drive apparatus for a piezoelectric actuator previously described can be achieved.

The electronic device of the present invention has a piezoelectric actuator having a vibrating body vibrated by applying a drive signal having a specific frequency to a piezoelectric element and a contact section that is provided to the vibrating body and that is in contact with the drive object, and the drive apparatus previously described.

With an electronic device with such a configuration, the drive frequency can be prevented from being locked in a state of resonance due to harmonics, and stable and reliable driving can therefore be achieved particularly in a wristwatch or other small electronic devices suitable for portability. In addition, since rectangular waves can be used as the drive signal, it is possible to simplify the drive circuits and to drive at a low voltage, and the present invention is suitable particularly for wristwatches and other small electronic devices that require energy conservation.

The control program for a drive apparatus for a piezoelectric actuator of the present invention is a control program for a drive apparatus for a piezoelectric actuator wherein a drive signal is supplied to a piezoelectric element, and the piezoelectric actuator has a vibrating body vibrated by applying a drive signal having a specific frequency to the piezoelectric element, and a contact section that is provided to the vibrating body and that is in contact with the drive object; wherein a computer incorporated into the drive apparatus is made to function as a vibrating state detection device for detecting the vibrating state of the vibrating body, a harmonics detection device for detecting that the vibrating body is resonating due to the harmonics of the drive signal and outputting a harmonics detection signal, and a frequency control device for controlling the frequency of the drive signal supplied to the piezoelectric element by controlling the frequency of the drive signal supplied to the piezoelectric element on the basis of the detection signal outputted from the vibrating state detection device when a harmonics detection signal is not outputted, and continuing to vary the frequency of the drive signal without controlling the frequency of the drive signal on the basis of the detection signal outputted from the vibrating state detection device while the harmonics detection signal is being outputted.

Also, the recording medium of the present invention is a recording medium capable of being read by a computer in which this program is stored.

According to the present invention, the drive frequency can be prevented from being locked in a state of resonance due to harmonics in the same manner as described above by making the computer incorporated into the drive apparatus to function as the above-described devices.

If the devices are configured as a computer, control that is appropriate for the object to be driven can be easily performed because the conditions can be easily altered merely by modifying the program.

Effects of the Invention

According to the present invention, when the drive frequency of the piezoelectric actuator is controlled, the drive frequency can be prevented from being locked in a state of resonance due to harmonics, there is no need to provide external components and the like, and the circuitry can be easily reduced in size.

DESCRIPTION OF THE PREFERRED EMBODIMENTS

The embodiments of the present invention are described below with reference to the diagrams.

First, an electronic timepiece having a date display mechanism driven by a piezoelectric actuator will be exemplified as an embodiment of an electronic device.

[1. Overall Configuration]

Figure 1:
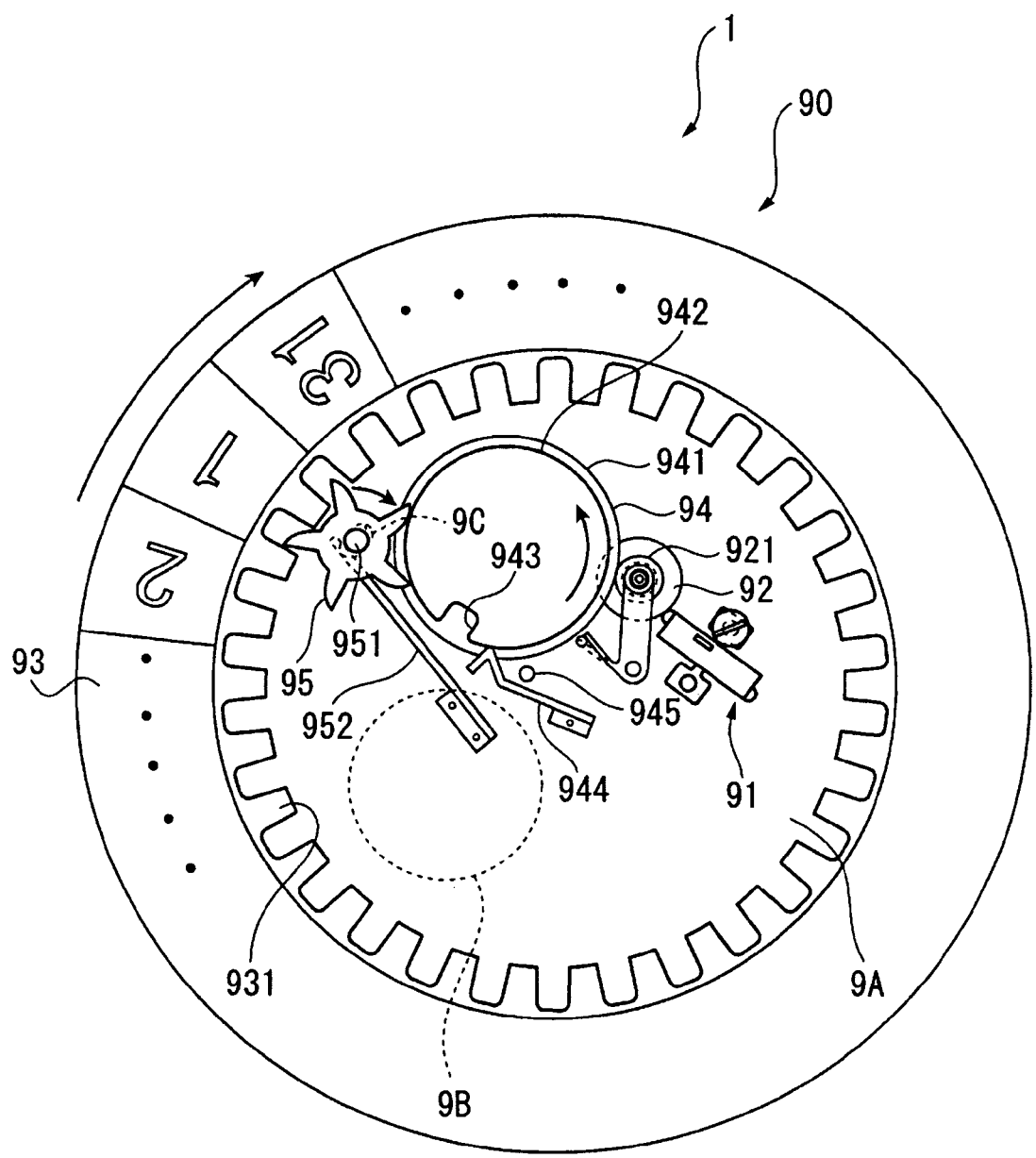
FIG. 1 is a plain view showing the configuration the main components of the date display mechanism in the electronic timepiece according to the first embodiment of the present invention.

FIG. 1 is a plan view showing a date display mechanism 90 (driven body) of an electronic timepiece 1 according to the present embodiment. In FIG. 1, the main components of the date display mechanism 90 is primarily composed of a piezoelectric actuator 91, a rotor 92 as the drive object rotatably driven (driven body 701) by the piezoelectric actuator 91, a deceleration gear train that decelerates and transmits the rotation of the rotor 92, and a date wheel 93 rotated by the drive force transmitted via the deceleration gear train. The deceleration gear train has a date turning intermediate wheel 94 and a date turning wheel 95. The piezoelectric actuator 91, the rotor 92, the date turning intermediate wheel 94, and the date turning wheel 95 are supported by a bottom plate 9A.

A disc-shaped dial (time indicating part 703) is provided at the top of the date display mechanism 90, and part of the outer peripheral surface of the dial is provided with a window for displaying the date, and is designed so that the date on the date wheel 93 is visible through the window. Also, a pointer movement gear train (not shown) connected to the stepping motor for driving the pointers and a secondary battery 9B as a power source are provided to the bottom (reverse side) of the bottom plate 9A. The secondary battery 9B supplies power to the circuits of the stepping motor, the piezoelectric actuator 91, and a voltage application apparatus (not shown). The structure may also be such that a power generator that generates power by utilizing solar (solar light) power or the rotation of an oscillating weight is connected to the secondary battery 9B, and the power generated by this power generator 702 is charged to the secondary battery 9B. Also, the power source is not limited to a secondary battery 9B that is charged by a power generator, and may be a common primary battery (a lithium ion battery, for example).

The date turning intermediate wheel 94 is composed of a large wheel 941 and a small wheel 942. The small wheel 942 has a cylindrical shape with a diameter that is slightly less than that of the large wheel 941, and a notch 943 with a substantially square shape is formed in the outer peripheral surface thereof. The small wheel 942 is fixed in place so as to concentric with respect to the large wheel 941. A gear 921 at the top of the rotor 92 meshes with the large wheel 941. Therefore, the date turning intermediate wheel 94 composed of the large wheel 941 and small wheel 942 rotates in conjunction with the rotation of the rotor 92.

A plate spring 944 is provided to the bottom plate 9A on the side of the date turning intermediate wheel 94, the proximal end of the plate spring 944 is fixed to the bottom plate 9A, and the distal end is bent into a substantially V shape. The distal end of the plate spring 944 is disposed so as to be capable of entering and exiting the notch 943 of the date turning intermediate wheel 94. A contact element 945 is disposed at a position adjacent to the plate spring 944, and this contact element 945 is designed to come into contact with the plate spring 944 when the date turning intermediate wheel 94 rotates and the distal end of the plate spring 944 enters the notch 943. A specific voltage is applied to the plate spring 944, and when the plate spring 944 comes into contact with the contact element 945, this voltage is applied to the contact element 945 as well. Therefore, the state in which the date wheel is turned can be determined by determining the voltage of the contact element 945, and the amount by which the date wheel 93 rotates in one day can be determined.

Determining the amount by which the date wheel 93 rotates is not limited to the use of the plate spring 944 or the contact element 945, and it is possible to use devices in which the rotating state of the rotor 92 or the date turning intermediate wheel 94 is determined and a specific pulse signal is outputted. Specifically, it is possible to use a conventional photoreflector, photointerrupter, MR sensor, or other such rotation encoder or the like.

The date wheel 93 has a ring shape, and an internal gear 931 is formed on the inner peripheral surface thereof. The date turning wheel 95 has a gear with five teeth and meshes with the internal gear 931 of the date wheel 93. Also, a shaft 951 is provided in the center of the date turning wheel 95, and this shaft 951 is inserted into a through-hole 9C formed in the bottom plate 9A. The through-hole 9C is formed extending along the peripheral direction of the date wheel 93. The date turning wheel 95 and the shaft 951 are urged upward and to the right in FIG. 1 by a plate spring 952 fixed on the bottom plate 9A. The urging action of the plate spring 952 also prevents the date wheel 93 from sliding.

Figure 2:
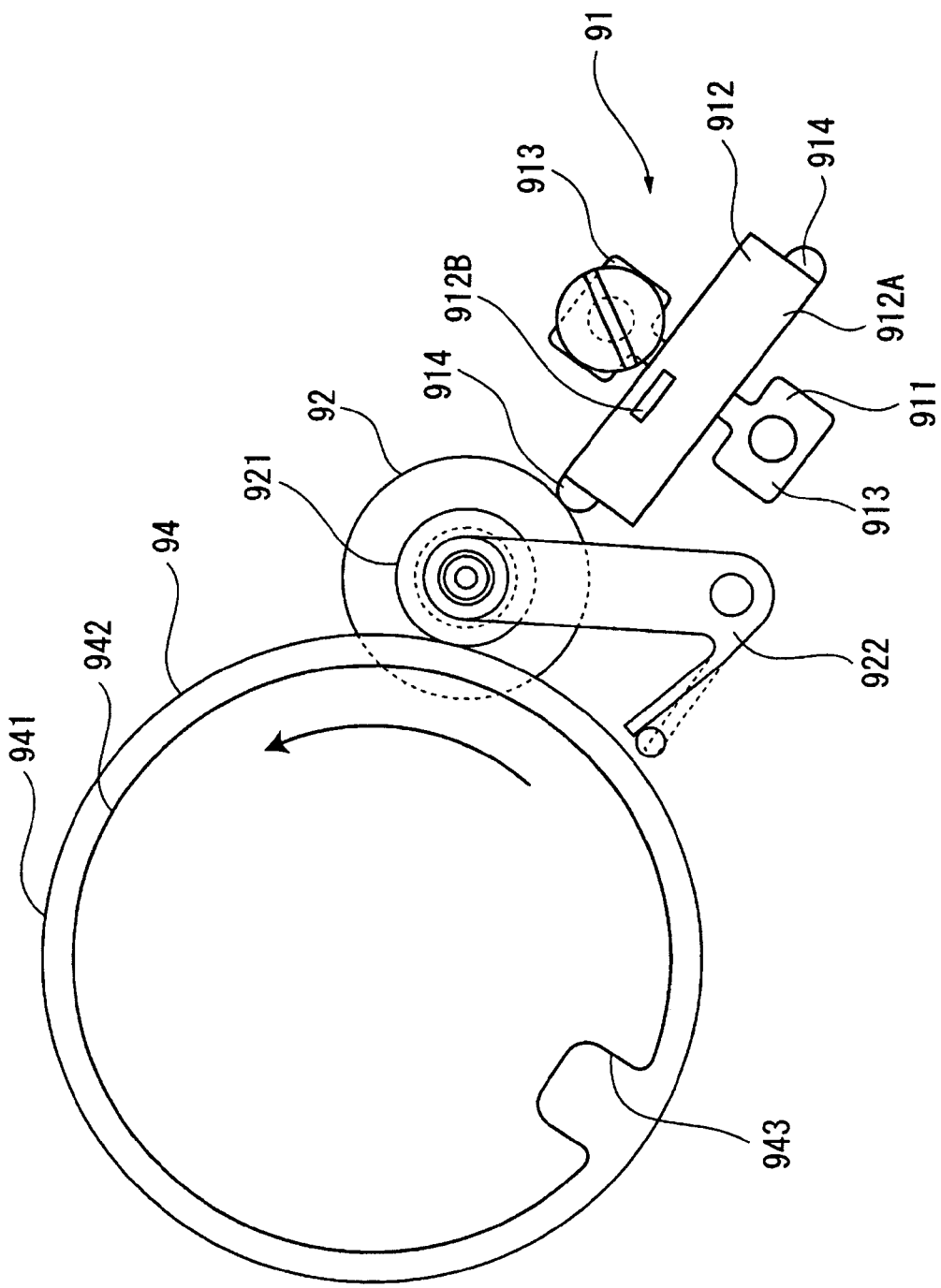
FIG. 2 is a plan view showing the piezoelectric actuator used in the electronic timepiece.

FIG. 2 shows an enlarged view of the piezoelectric actuator 91 and the rotor 92. As shown in FIG. 2, the piezoelectric actuator 91 has a substantially rectangular reinforcing plate 911, and a piezoelectric element 912 bonded to both sides of the reinforcing plate 911.

Arm sections 913 that protrude from both sides are formed substantially in the center of the reinforcing plate 911 in the longitudinal direction thereof, and one of these arm sections 913 is fixed in place on the bottom plate 9A by screws or the like. The other arm section 913 is not fixed to the bottom plate 9A, but remains in a free state and constitutes a weight that provides oscillation balance when the piezoelectric actuator 91 oscillates.

Substantially hemispherical convexities 914 that protrude along the longitudinal direction of the reinforcing plate 911 are formed at both ends of the diagonal of the reinforcing plate 911. One of these convexities 914 comes in contact with the side of the rotor 92.

The piezoelectric element 912 is formed into a substantially rectangular shape, and is bonded to the substantially rectangular sections on both sides of the reinforcing plate 911. Electrodes are formed from a plating layer on both sides of the piezoelectric element 912. A substantially rectangular determination electrode 912B is formed in the surface of the piezoelectric element 912 by insulating the plating layer with a groove. This determination electrode 912B is formed nearer to the rotor 92 than to the longitudinal center of the piezoelectric element 912, and nearer to the convexities 914 than to the transverse center of the piezoelectric element 912. The area other than the determination electrode 912B constitutes a drive electrode 912A. The surface area of the determination electrode 912B is set to $\frac{1}{30}$th or more and $\frac{1}{5}$th or less of the surface area of the drive electrode 912A, and is more preferably set to $\frac{1}{15}$th or more and $\frac{1}{10}$th or less.

When a voltage with a specific frequency is applied to the drive electrode 912A of the piezoelectric actuator 91, oscillation is created in a longitudinal primary oscillation mode in which the piezoelectric element 912 is elongated along the longitudinal direction. At this time, since the convexities 914 are provided to both ends of the diagonal of the piezoelectric actuator 91, the piezoelectric actuator 91 as a whole is unbalanced in weight in relation to the middle line in the longitudinal direction. As a result of this unbalance, oscillation is created in a curved secondary oscillation mode in which the piezoelectric actuator 91 curves in a direction substantially perpendicular to the longitudinal direction. Therefore, the piezoelectric actuator 91 creates oscillation that combines the longitudinal primary oscillation mode and the curved secondary oscillation mode, and the convexities 914 vibrate so as to form a substantially elliptical arc. At this time, since the piezoelectric actuator 91 is fixed to only one of the arm sections 913 and the convexities 914 are provided at the ends of the diagonal and bear the reactive force from the rotor 92, the node of oscillation in the longitudinal primary oscillation mode and the node of oscillation in the curved secondary oscillation mode are out of alignment with the center of the piezoelectric element 912. In other words, the determination electrode 912B is formed at a position in the piezoelectric actuator 91 that includes the node of oscillation in the longitudinal primary oscillation mode and the node of oscillation in the curved secondary oscillation mode. Therefore, in the present embodiment, the vibrating body 910 is composed of the reinforcing plate 911 and the piezoelectric element 912, and the contact section is composed of the convexities 914.

The drive electrode 912A, the determination electrode 912B, and the reinforcing plate 911 are all connected to the drive apparatus (voltage application apparatus) (not shown) by a lead wire or the like. The specific configuration of the drive apparatus is described later.

A plate spring 922 is mounted on the rotor 92, and the rotor 92 is urged towards the piezoelectric actuator 91. An appropriate frictional force is thereby created between the convexities 914 and the side of the rotor 92, resulting in satisfactory efficiency in transmitting the drive force of the piezoelectric actuator 91.

In such a timepiece 1, the piezoelectric actuator 91 creates oscillation combining the longitudinal primary oscillation mode and the curved secondary oscillation mode when a drive signal with a specific frequency is applied due to the fact that the drive apparatus controls the drive signal for the piezoelectric actuator 91. The convexities 914 oscillate so as to form a substantially elliptical arc in which these oscillation modes are combined, and the rotor 92 is pressed in a portion of this oscillation arc to thereby rotatably drive the rotor 92.

The rotational movement of the rotor 92 is transmitted to the date turning intermediate wheel 94, and when the teeth of the date turning wheel 95 mesh with the notch 943, the date turning wheel 95 is rotated by the date turning intermediate wheel 94, and the date wheel 93 is rotated. The date displayed by the date wheel 93 is changed as a result of this rotation.

[2. Configuration of Drive Apparatus for Piezoelectric Actuator]

Next, the configuration of the drive apparatus 50 of the piezoelectric actuator 91 will be described with reference to FIG. 3.

Figure 3:
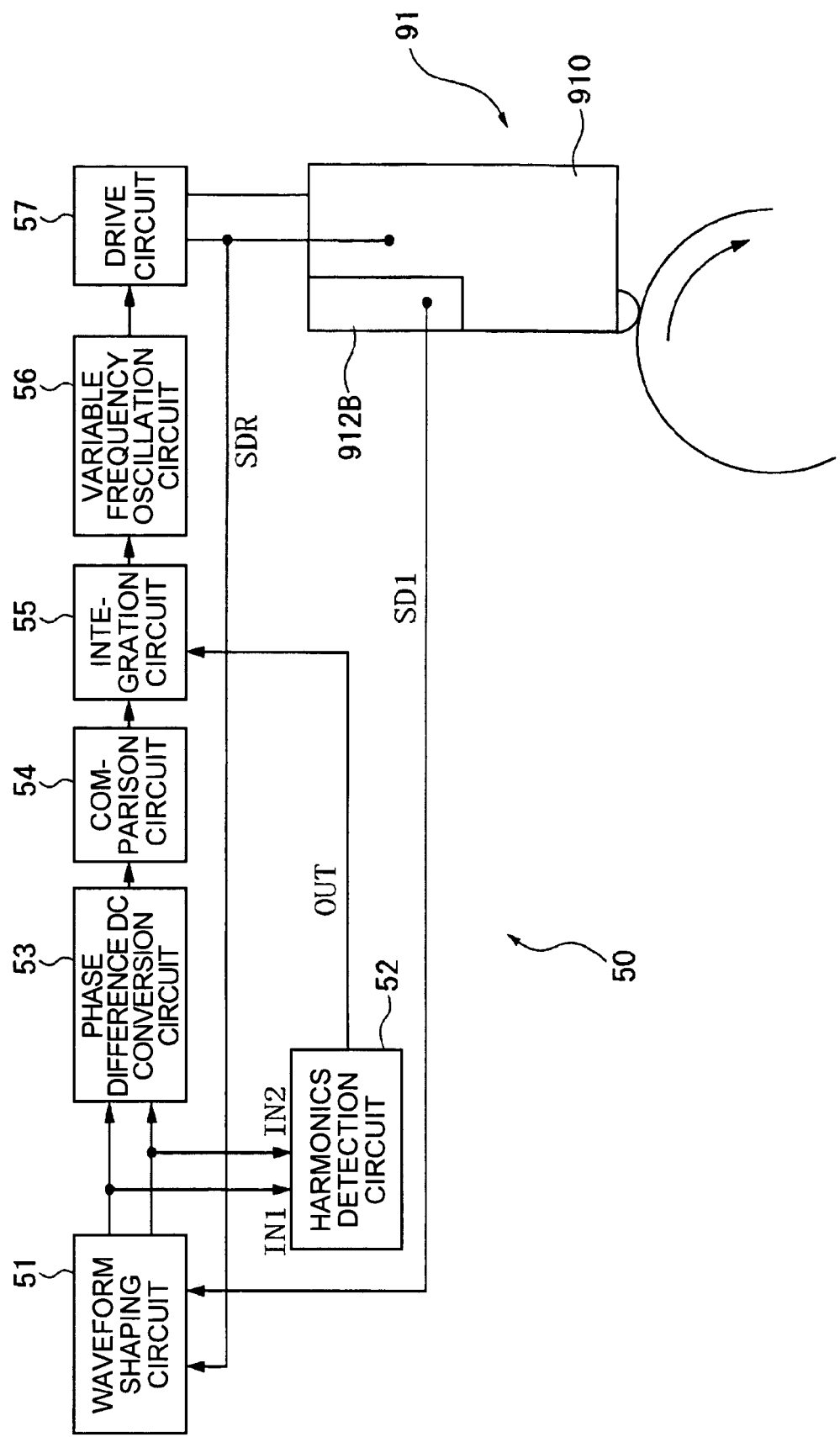
FIG. 3 is a block view showing the internal configuration of the drive apparatus of the piezoelectric actuator.

In FIG. 3, the drive apparatus 50 in configured with a waveform shaping circuit 51, a harmonics detection circuit 52 (harmonics detection means), a phase difference-DC conversion circuit 53 (phase difference-DC conversion means), a comparison circuit 54 (comparison mean), an integration circuit 55, a variable frequency oscillation circuit 56, and a drive circuit 57.

The waveform shaping circuit 51 is a circuit that is electrically connected to the drive circuit 57 and the determination electrode 912B of the vibrating body 910, and that shapes the waveforms of the drive signal SDR outputted from the drive circuit 57 and of the detection signal SD1 outputted from the determination electrode 912B into rectangular waves, for example, and outputs the results to the phase difference-DC conversion circuit 53.

The harmonics detection circuit 52 is configured to detect whether the vibrating body 910 is resonating due to the harmonics of the drive signal and to output a harmonics detection signal if the body is resonating due to harmonics. Therefore, in the present embodiment, the harmonics detection device is composed of the harmonics detection circuit 52. A specific example of the harmonics detection circuit 52 will be described later.

The phase difference-DC conversion circuit 53 is a circuit that outputs a signal according to the phase difference between the drive signal SDR and detection signal SD1 shaped by the waveform shaping circuit 51. Specifically, a direct current signal (phase difference signal) is outputted at a voltage level corresponding to the phase difference.

The comparison circuit 54 compares the voltage of the phase difference signal outputted from the phase difference-DC conversion circuit 53 with the voltage of the target phase difference signal having a voltage level corresponding to a preset target phase difference, and outputs the comparison information to the integration circuit 55.

Therefore, in the present embodiment, the vibrating state detection device (vibration state detection means) for detecting the vibrating state of the vibrating body 910 is composed of the phase difference-DC conversion circuit 53 and the comparison circuit 54.

The integration circuit 55 accumulates the comparison information outputted from the comparison circuit 54, and outputs the accumulated information to the variable frequency oscillation circuit 56. Also, when a harmonics detection signal is outputted from the harmonics detection circuit 52, the integration circuit 55 outputs a signal for reducing the frequency of the drive signal to the variable frequency oscillation circuit 56 without accumulating the comparison information from the comparison circuit 54.

The variable frequency oscillation circuit 56 outputs a frequency signal corresponding to the voltage of the signal outputted from the integration circuit 55 to the drive circuit 57. The drive circuit 57 then outputs a drive signal with a frequency corresponding to the frequency of the inputted drive signal to the piezoelectric element 912.

Therefore, in the present embodiment, the frequency control device (frequency control means) for controlling the frequency of the drive signal supplied to the piezoelectric element is composed of the integration circuit 55, the variable frequency oscillation circuit 56, and the drive circuit 57.

[3. Configuration of the Harmonics Detection Circuit]

Figure 4:
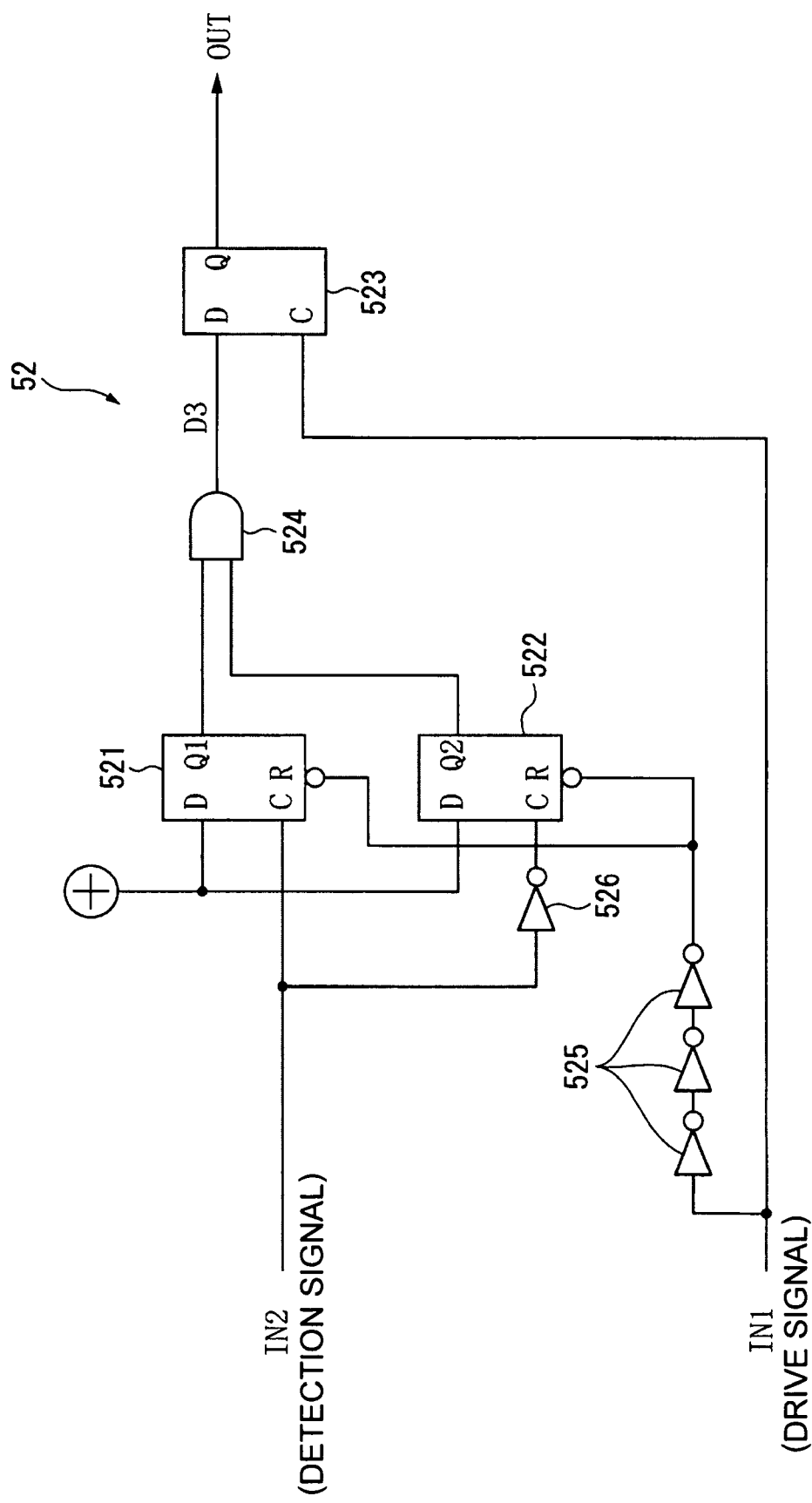
FIG. 4 is a circuit diagram showing the harmonics detection circuit of the first embodiment.

Next, the harmonics detection circuit 52 of the present embodiment will be described with reference to FIG. 4.

The harmonics detection circuit 52 is configured with bistable trigger circuits 521, 522, and 523, an AND gate 524, and NOT gates 525 and 526. This harmonics detection circuit 52 is configured such that when the detection signal inputted to the input terminal IN2 both rises (changes from an L level to an H level) and falls (changes from an H level to an L level) within half a cycle of a drive signal inputted to the input terminal IN1, or, specifically, while the drive signal is at an L level, then the harmonics detection signal output OUT is an H level signal, and at all other times, the harmonics detection signal output is an L level signal.

[4. Drive Method for the Piezoelectric Actuator]

Next the drive method for the piezoelectric actuator 91 will be described with reference to FIGS. 5 through 9.

When the drive apparatus 50 initiates drive control for the piezoelectric actuator 91, the frequency of the drive signal is set to the upper limit (fmax) of a preset frequency range of the drive signal and is inputted from the drive circuit 57 to the piezoelectric element 912 (step 1; "step" is hereinafter abbreviated as "S").

Figure 6:
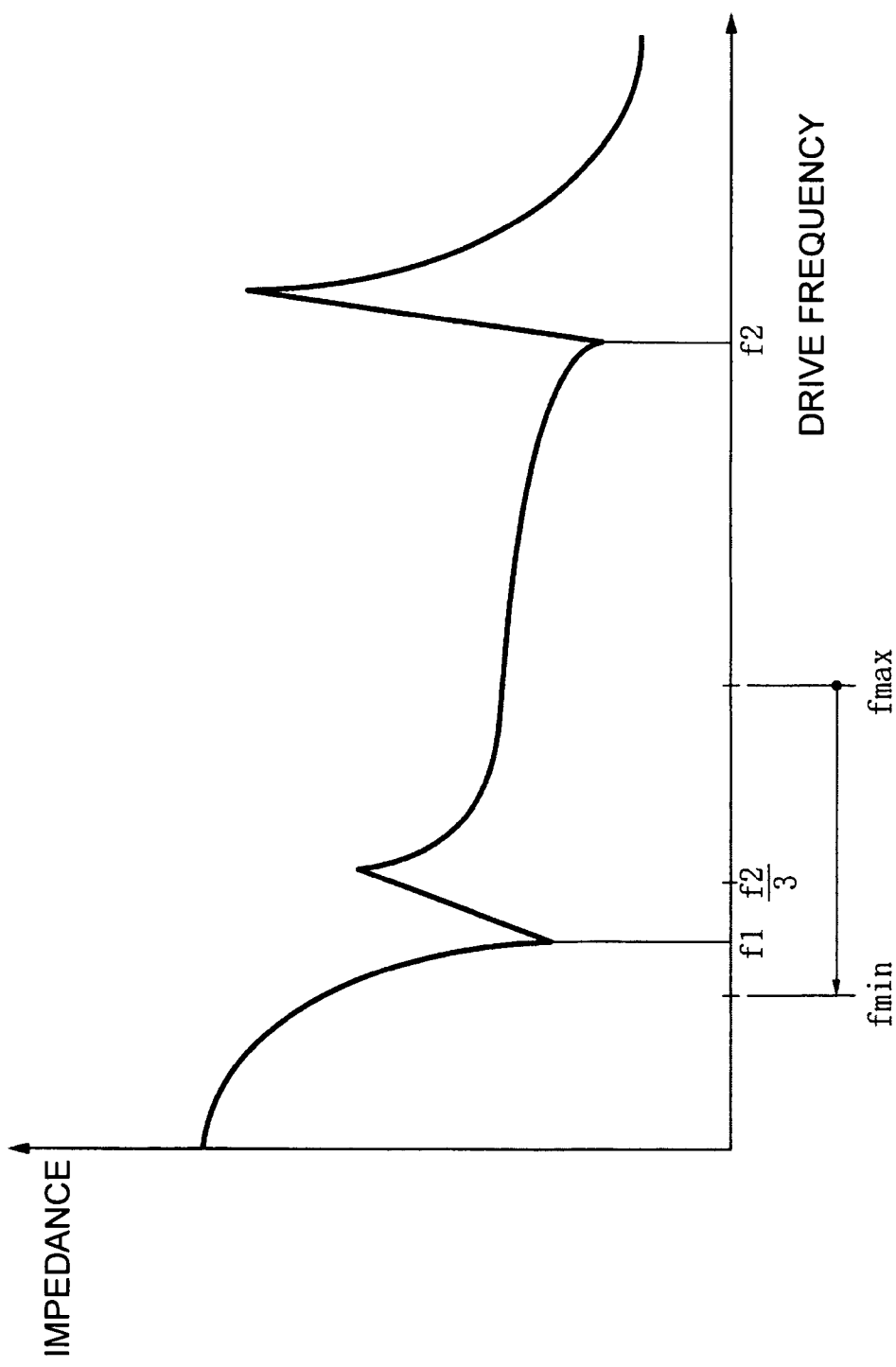
FIG. 6 is a graph showing the relationship between drive frequency and impedance in the piezoelectric actuator.

The frequency range (fmax to fmin) of the drive signal is set as follows, as indicated in the graph in FIG. 6 showing the relationship between drive frequency and the impedance of the vibrating body 910.

As used herein, f1 is an effective resonance point for driving the vibrating body 910, and f2 is an ineffective resonance point for driving that occurs due to the effects of the shape and the like of the piezoelectric actuator 91. The relationship between the two is f1<f2/3.

In this case, the following relationships hold: f2/3<fmax<f2, and fmin<f1.

Figure 5:
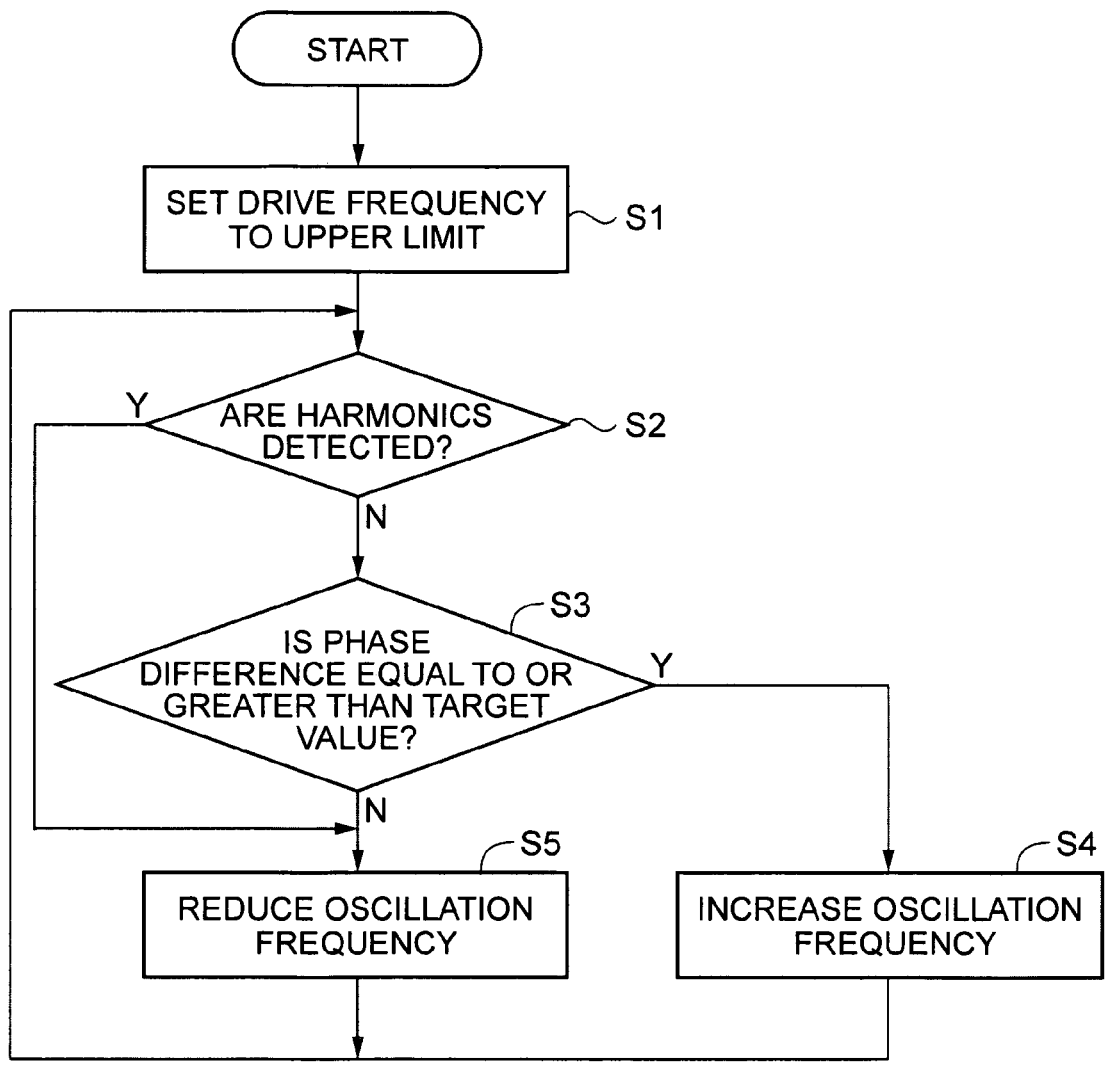
FIG. 5 is a flowchart showing the process of controlling the drive frequency in the first embodiment.

When input of the drive signal is initiated, the drive apparatus 50 inputs a drive signal and a detection signal to the harmonics detection circuit 52 via a waveform shaping circuit 51, and determines whether harmonics have been detected, as shown in FIG. 5 (S2).

Figure 7:
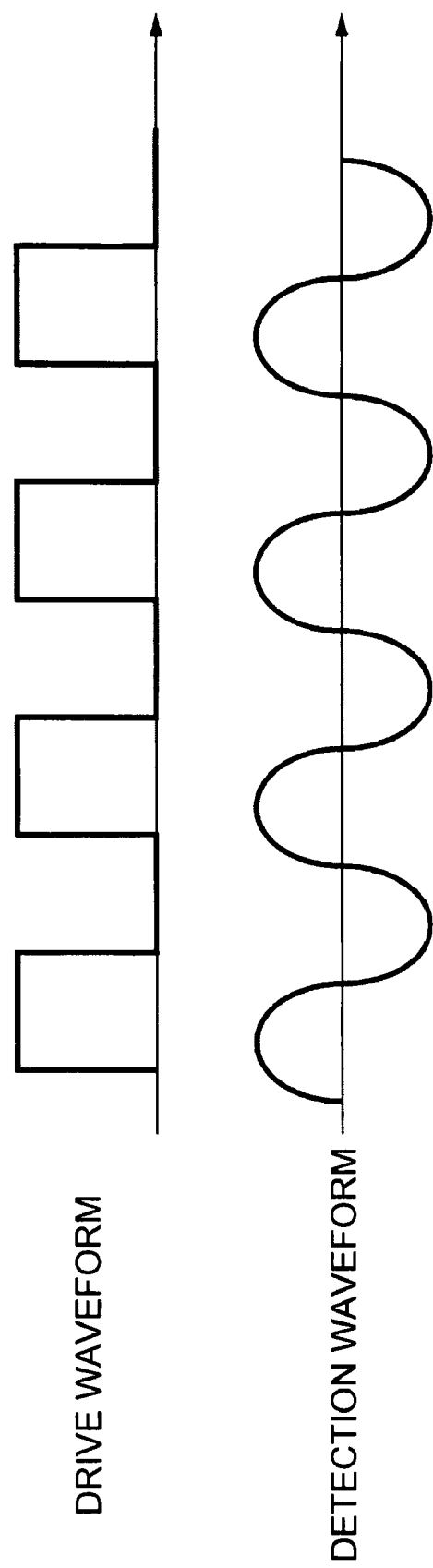
FIG. 7 is a diagram showing the drive signal waveform and the detection signal waveform in a state of normal control.

If harmonics are not detected in S1, the drive signal and the detection signal are signals with the same frequency that have a certain phase difference, as shown in FIG. 7. Therefore, the drive apparatus 50 determines through the comparison circuit 54 whether the phase difference between the signals determined by the phase difference-DC conversion circuit 53 is equal to or greater than the target phase difference (target value) (S3).

If the phase difference between the drive signal and the detection signal is equal to or greater than the target value, then a corresponding signal is outputted from the comparison circuit 54, and the oscillation frequency (drive frequency) of the drive signal outputted from the drive circuit 57 is increased via the integration circuit 55 and the variable frequency oscillation circuit 56 (S4).

On the other hand, if the phase difference between the drive signal and the detection signal is less than the target value, then a corresponding signal is outputted from the comparison circuit 54, and the oscillation frequency (drive frequency) of the drive signal outputted from the drive circuit 57 is reduced via the integration circuit 55 and the variable frequency oscillation circuit 56 (S5).

As a result of the control described above, normally the drive frequency decreases sequentially from fmax, the detected phase difference reaches the target value near f1, the drive frequency is locked, or, in other words, a state is reached in which the frequency repeatedly decreases and increases in an alternating fashion, and the piezoelectric actuator 91 is driven in a normal manner.

[5. Operation of the Harmonics Detection Circuit]

Figure 8:
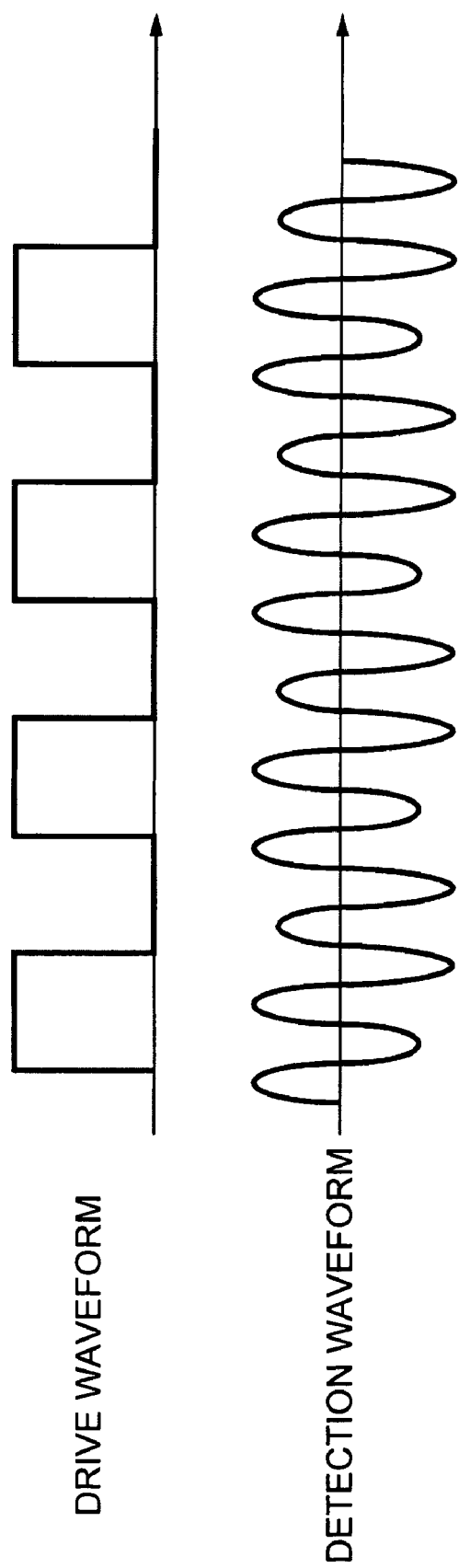
FIG. 8 is a diagram showing the drive signal waveform and the detection signal waveform in a state of resonance due to harmonics.

In the process of controlling the drive frequency, if the drive frequency reaches ⅓ of f2 (=f2/3), the vibrating body 910 sometimes causes resonance as a result of the three-dimensional components of the drive signal. If such resonance occurs as a result of the three-dimensional components (harmonics) of the drive signal, the detected waveform is as shown in FIG. 8.

In the present embodiment, this state of resonance due to harmonics is detected by the harmonics detection circuit 52. The harmonics detection circuit 52 detects the state of resonance due to harmonics on the basis of whether the detection signal either only rises or only falls once within half a cycle of the drive signal as shown in FIG. 7, or whether the detection signal both rises and falls within half a cycle of the drive signal as shown in FIG. 8.

Specifically, in the harmonics detection circuit 52, the drive signal outputted from the waveform shaping circuit 51 is inputted to the input terminal IN1, and the detection signal outputted from the waveform shaping circuit 51 is inputted to the input terminal IN2. The input terminal IN1 is inputted to reset inputs R of the bistable trigger circuits 521 and 522 via three NOT gates 525 connected in series. Therefore, when the drive signal is at an L level, an H level signal is inputted to the reset inputs R of the bistable trigger circuits 521 and 522, and the reset is released.

An H level signal is usually inputted to the data inputs D of the bistable trigger circuits 521 and 522. Also, a detection signal inputted to the input terminal IN2 is inputted in an unchanged state to the clock input C of the bistable trigger circuit 521, and the detection signal is then inverted and inputted to the clock input C of the bistable trigger circuit 522 via the NOT gate 526.

Figure 9:
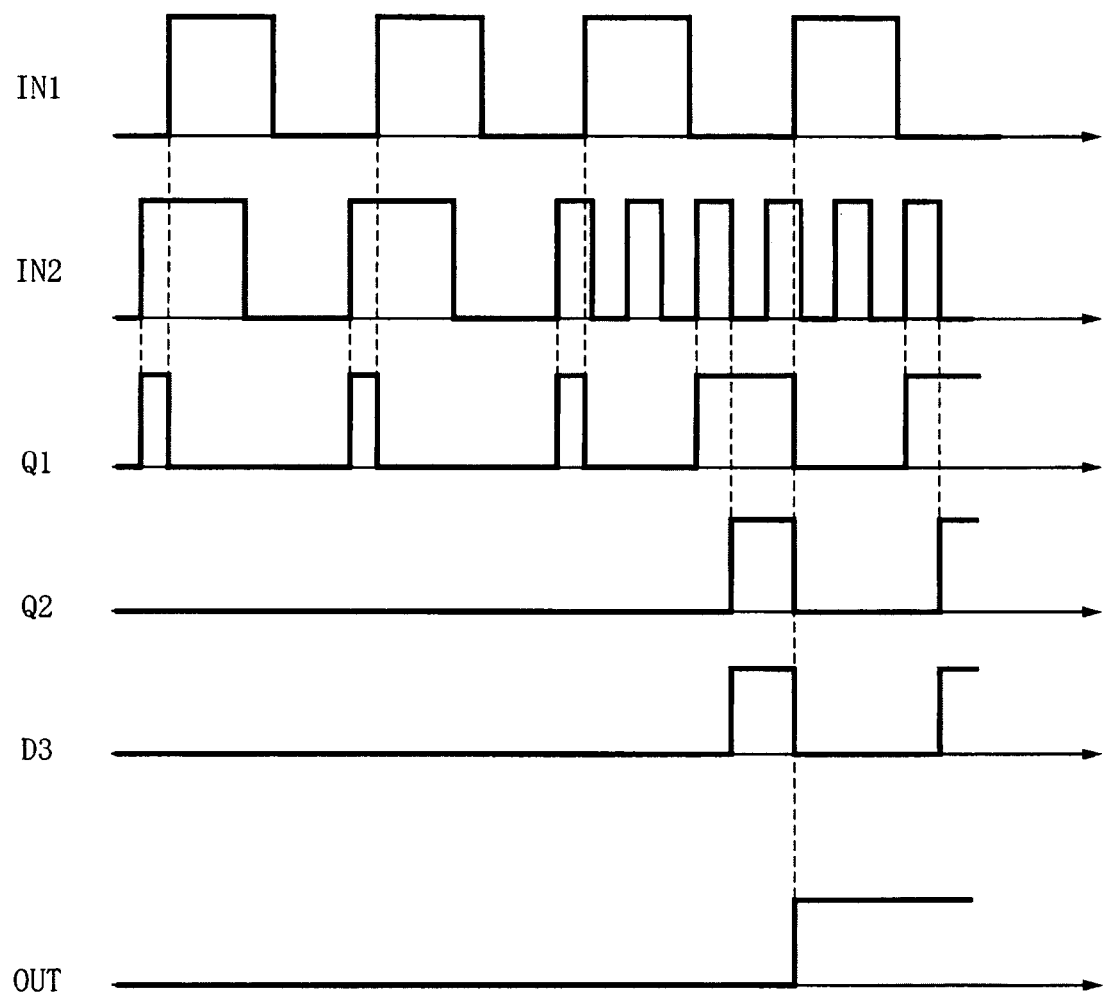
FIG. 9 is a timing chart showing the process of the harmonics detection circuit in the first embodiment.

Therefore, when the drive signal (IN1) is at an L level, or more specifically, when the bistable trigger circuits 521 and 522 are released from a reset state, the output Q1 of the bistable trigger circuit 521 changes from an L level to an H level when the detection signal (IN2) changes from an L level to an H level, as shown in the timing chart in FIG. 9. When the bistable trigger circuits 521 and 522 are released from a reset state, the output Q2 of the bistable trigger circuit 522 changes from an L level to an H level when the detection signal changes from an H level to an L level.

The outputs Q1 and Q2, having reached an H level, then change from an H level to an L level when the drive signal (IN1) changes to an H level and the bistable trigger circuits 521 and 522 are reset.

The AND gate 524 herein outputs an H level signal only when both the outputs Q1 and Q2 are at an H level. The outputs Q1 and Q2 of the bistable trigger circuits 521 and 522 are both at an H level when the detection signal both rises (changes from an L level to an H level while the output Q1 is at an H level) and falls (changes from an H level to an L level while the output Q2 is at an H level) within half a cycle of the drive signal, or, more specifically, while the drive signal is at an L level, as shown in FIG. 9.

When the output D3 of the AND gate 524 is at an H level, the output Q of the bistable trigger circuit 523 changes from an L to H level when the drive signal rises. Therefore, if the output Q of the bistable trigger circuit 523 is the harmonics detection signal OUT of the harmonics detection circuit 52, the harmonics detection signal is an H level signal when the detection signal both rises and falls within half a cycle of the drive signal.

The output Q of the bistable trigger circuit 523 is switched to an L level if the drive signal rises when the output D3 of the AND gate 524 is at an L level. In other words, the drive signal is at an L level when the detection signal neither rises nor falls within half a cycle of the drive signal, more specifically, when there is no state of resonance due to harmonics.

Therefore, it is possible to detect whether the vibrating body 910 is in a state of resonance due to harmonics on the basis of the harmonics detection signal OUT of the harmonics detection circuit 52.

When a state of resonance due to harmonics is detected in S2 (when the harmonics detection signal is at an H level), the integration circuit 55 of the drive apparatus 50 reduces the oscillation frequency irrespective of the comparison results of the comparison circuit 54 (S5), as shown in the flowchart of FIG. 5.

As a result of this control, the drive frequency passes through f2/3 and nears f1, and therefore, the state of resonance due to harmonics is then released, the detected phase difference reaches the target value when the drive frequency is near f1, the drive frequency is locked, and normal driving is executed.

When the drive frequency reaches the lower limit (fmin) without being locked near f1, it is again returned to the upper limit (fmax) and control may be continued.

[6. Effects of the Embodiments]

According to the present embodiment, the following operational effects can be achieved.

(1) The drive apparatus 50 of the piezoelectric actuator 91 of the present embodiment includes a harmonics detection circuit 52, and when a state of resonance due to harmonics is detected, the drive frequency is not controlled based on the phase difference between the drive signal and the detection signal, but since the drive frequency is continually varied (decreased), the drive frequency can be reliably prevented from locking in a state of resonance due to harmonics and the piezoelectric actuator 91 from failing to drive.

Therefore, the drive frequency can be controlled to reach a specific target phase difference, and the driving of the piezoelectric actuator 91 can be efficiently controlled in a normal manner, even when a state of resonance due to harmonics has occurred when a rectangular drive signal is used.

(2) The drive apparatus 50 can be configured merely by adding the harmonics detection circuit 52 configured from logical circuits to the conventional configuration, and the circuitry can therefore be reduced in size, the circuits can be easily integrated, and costs can be reduced in comparison with the case in which drive coils and other such external components are provided to prevent the drive frequency from locking in a state of resonance due to harmonics. Therefore, the present invention is particularly suitable for being incorporated into wristwatches and other such small electronic devices.

(3) The harmonics detection circuit 52 can detect a state of resonance due to harmonics by separating and inputting the signals outputted from the waveform shaping circuit 51. Therefore, there is no need to provide a filter to the input of the detection signal, and the detection characteristics can be reliably detected to achieve high precision control without affecting the characteristics. Also, since there is no need to provide a filter to the output of the drive signal, the piezoelectric actuator 91 can be efficiently driven without attenuating the output.

(4) Since an electronic timepiece is configured with a piezoelectric actuator 91 having a vibrating body with a piezoelectric element 912 and convexities 914 that are provided to the vibrating body and that come in contact with the driven object, a drive apparatus 50 with the configuration previously described, and a date display mechanism 90 driven by the piezoelectric actuator 91, it is possible to provide an electronic timepiece with low power consumption that can reliably drive the driven object.

Second Embodiment

Next, the second embodiment of the present invention will be described with reference to FIGS. 10 through 12.

Figure 10:
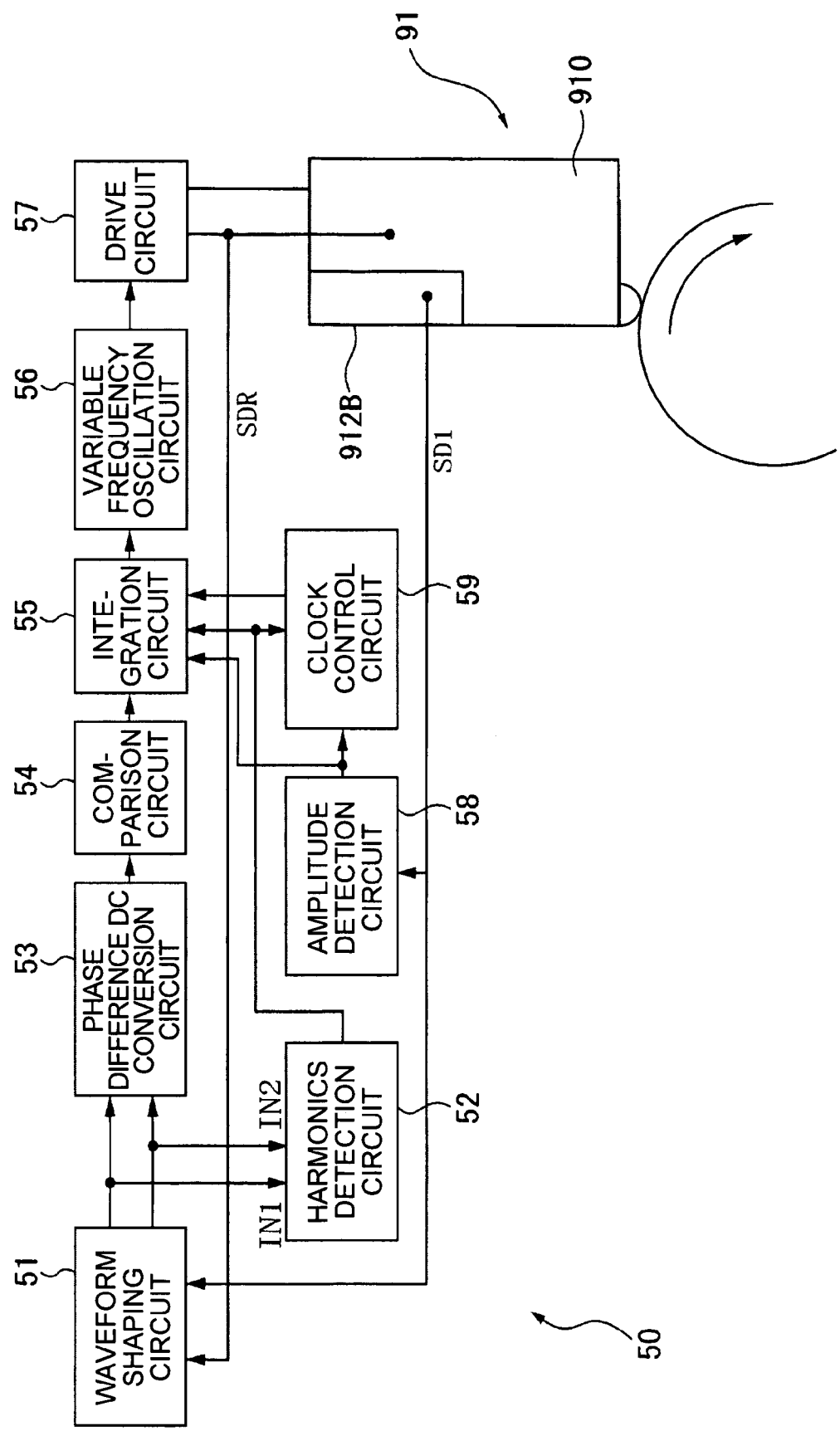
FIG. 10 is a block view showing the internal configuration of the drive apparatus in the second embodiment.
Figure 11:
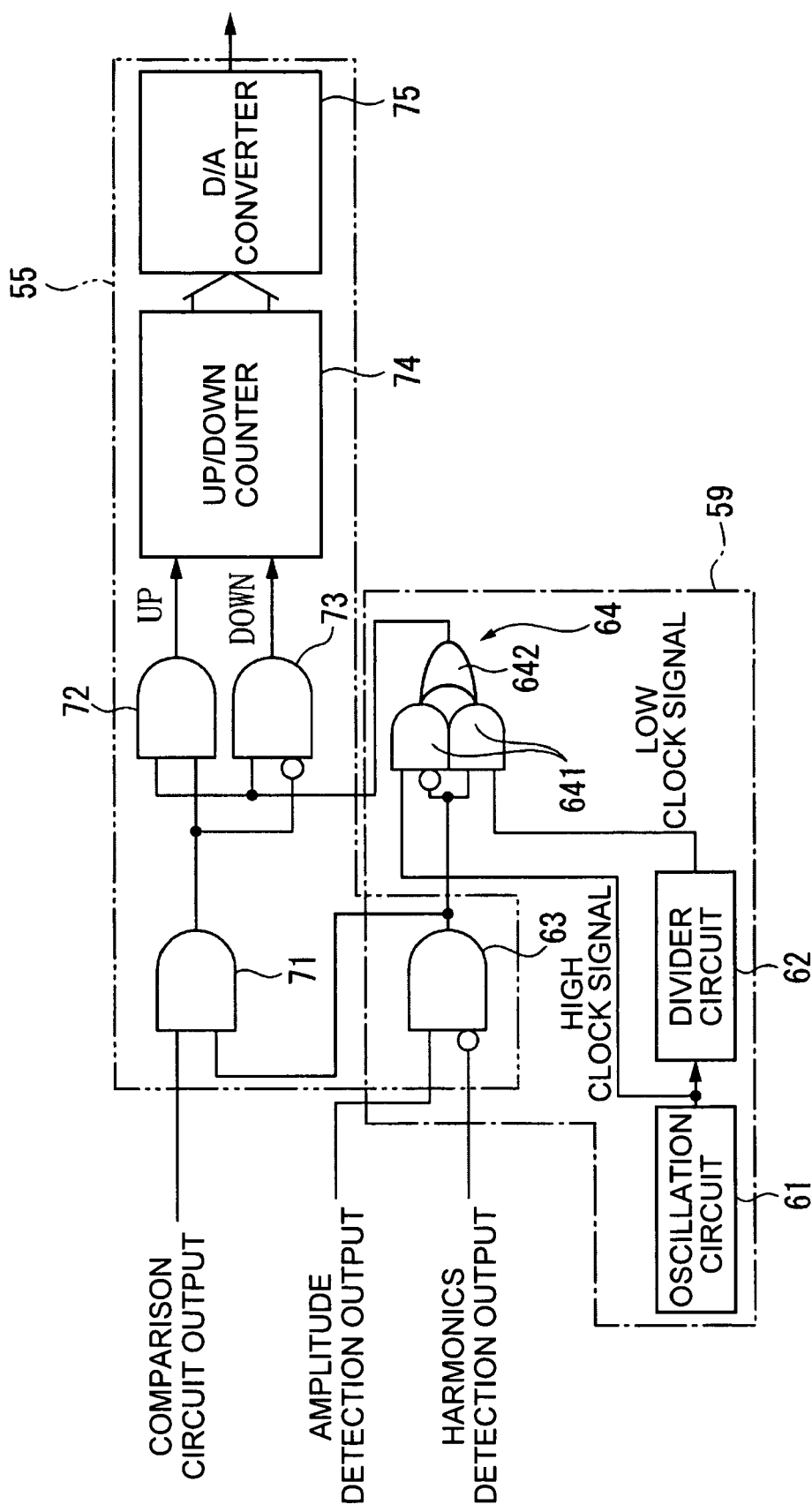
FIG. 11 is a circuit diagram showing the integration circuit and the clock control circuit of the second embodiment.

In the second embodiment, as shown in FIG. 10, an amplitude detection circuit 58 (amplitude detection means) and a clock control circuit 59 (frequency-change-rate change means) are added to the configuration of the first embodiment.

The amplitude detection circuit 58 (amplitude detection mean), which is an amplitude detection device, is designed to detect whether the amplitude of the detection signal is equal to or greater than a specific value, to output an H level signal if it is equal to or greater than the specific value, and to output an L level signal if it is less than the specific value, for which a conventionally known amplitude detection device can be used.

The clock control circuit 59 is designed to switch the amount of change in the drive frequency (rate of change of the frequency) per unit time to a high speed or a low speed on the basis of an amplitude detection signal or a harmonics detection signal.

Therefore, in the present embodiment, the frequency-change-rate change device is configured from the amplitude detection circuit 58 and the clock control circuit 59.

The configuration of the clock control circuit 59 and integration circuit 55 of the present embodiment will now be described with reference to FIG. 11.

The clock control circuit 59 is configured with an oscillation circuit 61, a divider circuit 62, an AND gate 63, and a clock selection circuit 64.

The divider circuit 62 divides and outputs clock signals outputted from the oscillation circuit 61, and therefore outputs clock signals of lower speeds than clock signals directly outputted from the oscillation circuit 61. As a result, high frequency signals (high clock signals) are outputted from the oscillation circuit 61, and signals of lower frequencies than the high clock signals (low clock signals) are outputted from the divider circuit 62.

The clock selection circuit 64 is configured from two composite gates equivalent to an AND gate 641 and an OR gate 642, and selects and outputs a high clock signal or a low clock signal according to the output from the AND gate 63. In the present embodiment, a low clock signal is selected when an H level signal is outputted from the AND gate 63, and a high clock signal is selected when an L level signal is outputted.

The amplitude detection signal outputted from the amplitude detection circuit 58 and the harmonics detection signal outputted from the harmonics detection circuit 52 are inputted to the AND gate 63.

At this time, since the harmonics detection signal is inverted and inputted, if the harmonics detection signal is at an H level, then the output of the AND gate 63 will always be at an L level, and a high clock signal is selected in the clock selection circuit 64.

The output of the AND gate 63 is at an L level and a high clock signal is selected in the clock selection circuit 64 also when the harmonics detection signal is at an L level and the amplitude detection signal is at an L level.

On the other hand, when the harmonics detection signal is at an L level and the amplitude detection signal is at an H level, the output of the AND gate 63 is at an H level and a low clock signal is selected in the clock selection circuit 64.

Specifically, the clock control circuit 59 outputs a low clock signal to the integration circuit 55 only when the amplitude of the detection signal is equal to or greater than a specific value and a state of resonance due to harmonics is not detected, and outputs a high clock signal to the integration circuit 55 at all other times.

The integration circuit 55 is configured with the AND gate 63, AND gates 71 to 73, an up/down counter 74, and a D/A converter 75.

The AND gates 71 to 73 are circuits for selecting whether the counter value of the up/down counter 74 will be increased or reduced.

Specifically, when an H level signal is outputted from the AND gate 71, a clock signal outputted from the clock control circuit 59 is inputted as an up clock to the up/down counter 74 via the AND gate 72, and the counter value is increased.

On the other hand, when an L level signal is outputted form the AND gate 71, the clock signal outputted from the clock control circuit 59 is inputted as a down clock to the up/down counter 74 via the AND gate 73, and the counter value is reduced.

A frequency control voltage value corresponding to the counter value of the up/down counter 74 is set in the D/A converter 75. The D/A converter 75 then outputs a frequency control voltage equivalent to the frequency control voltage value corresponding to this counter value to the variable frequency oscillation circuit 56 when the counter value outputted from the up/down counter 74 is inputted.

The variable frequency oscillation circuit 56 outputs a frequency signal corresponding to the voltage outputted from the D/A converter 75, and the drive circuit 57 outputs a frequency drive signal corresponding to the frequency of the inputted signal to the piezoelectric element 912.

At this time, the D/A converter 75 is set such that the drive frequency of the drive signal increases when the counter value of the up/down counter 74 increases, and the drive frequency decreases when the counter value decreases.

The output of the AND gate 71 is set at an H level or an L level according to the output from the comparison circuit 54 when the output of the AND gate 63 is at an H level, or, in other words, when the amplitude of the detection signal is equal to or greater than a specific value and a state of resonance due to harmonics is not detected. Therefore, under these conditions, the increase or decrease in drive frequency is controlled according to the results of the comparison circuit 54. Also, under these conditions, a low clock signal is detected by the clock control circuit 59, and therefore the rate of change of the increase or decrease in drive frequency is at a low speed, and the frequency can easily be locked at a frequency at which the detected phase difference reaches the target phase difference.

On the other hand, when the amplitude of the detection signal is less than a specific value, a state of resonance due to harmonics is detected, and the output of the AND gate 63 is at an L level, the down clock continues to be inputted to the up/down counter 74 as a result, irrespective of the output of the comparison circuit 54.

Figure 12:
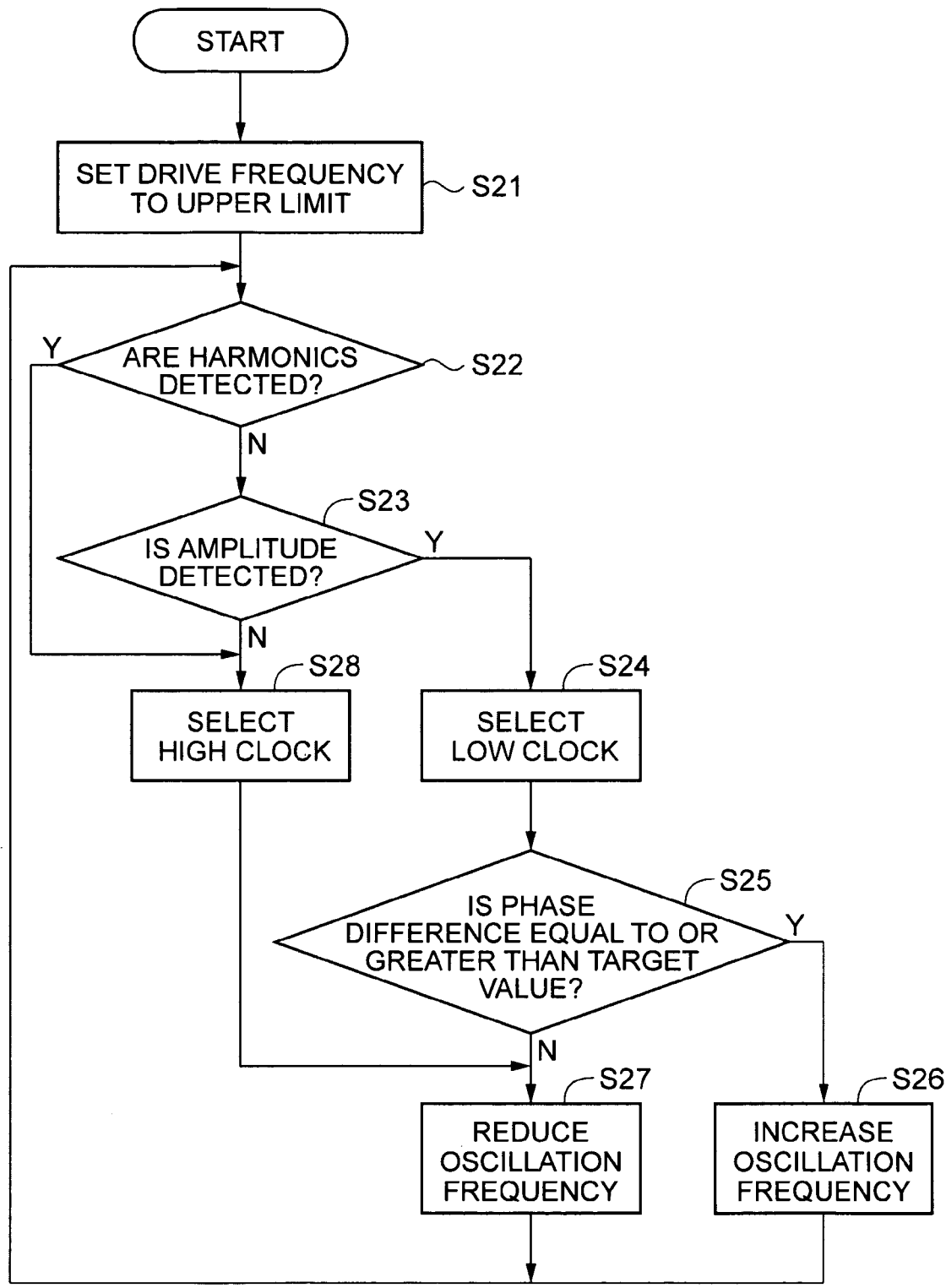
FIG. 12 is a flowchart showing the process of controlling the drive frequency in the second embodiment.

Therefore, drive frequency control via the drive apparatus 50 of the second embodiment is as shown in the flowchart in FIG. 12.

Specifically, when the drive apparatus 50 initiates drive control of the piezoelectric actuator 91, the frequency of the drive signal is set to a preset upper limit (fmax) of the frequency range of the drive signal and is inputted to the piezoelectric element 912 from the drive circuit 57 (S21).

Next, it is determined whether or not a state of resonance due to harmonics has been detected (S22). If harmonics are not detected in S22, then it is determined whether or not the amplitude has been detected (S23).

If the amplitude has been detected, a low clock signal is selected by the clock control circuit 59 (S24).

Next, the drive apparatus 50 determines through the comparison circuit 54 whether or not the phase difference of the signals determined by the phase difference-DC conversion circuit 53 is equal to or greater than the target phase difference (target value) (S25).

If the phase difference between the drive signal and the detection signal is equal to or greater than the target value, a corresponding signal is outputted from the comparison circuit 54, and the frequency of the drive signal outputted from the drive circuit 57 is increased via the integration circuit 55 and the variable frequency oscillation circuit 56 (S26).

On the other hand, if the phase difference between the drive signal and the detection signal is less than the target value, a corresponding signal is outputted from the comparison circuit 54, and the frequency of the drive signal outputted from the drive circuit 57 is decreased via the integration circuit 55 and the variable frequency oscillation circuit 56 (S27).

As a result of the control described above, the detected phase difference reaches the target value when the drive frequency is near f1, the drive frequency is locked, and normal driving is executed.

When the a state of resonance due to harmonics is detected in S22, or, when it is determined in S23 that the amplitude has not been detected, a high clock signal is selected by the clock control circuit 59 (S28). The drive apparatus 50 then performs a process of decreasing the oscillation frequency without comparing the phase difference (S27).

Therefore, in the present embodiment, the drive frequency (oscillation frequency) is increased only when a state of resonance due to harmonics is not detected (No, in S22), the amplitude of the detection signal is equal to or greater than a specific value (Yes, in S23), and the phase difference between the drive signal and the detection signal is equal to or greater than the target value (Yes, in S25), and at all other times, the drive frequency continues to decrease. Therefore, the drive frequency continues to decrease at a high speed (high clock) and is not locked even if the drive frequency reaches f2/3, and when the drive frequency nears f1 and the amplitude of the detection signal is equal to or greater than a specific value, the drive frequency either increases or decreases at a low speed, and the drive frequency is locked and normal driving is executed when the phase difference between the drive signal and the detection signal reaches the target value.

According to the second embodiment, the same operating effects as in the first embodiment can be achieved.

(2-1) Furthermore, since a frequency-change-rate change device composed of the amplitude detection circuit 58 and the clock control circuit 59 is provided and a selection is made between a high clock signal and a low clock signal, and the speed at which the drive frequency changes can therefore be increased to a high speed when a state of resonance due to harmonics is detected or when the amplitude is less than the specific value, or, in other words, when the drive frequency is not at a frequency at which the frequency of the current drive signal reaches the target value. Therefore, the frequency can be changed at a high speed to a drive frequency at which normal driving is performed, and the time needed to make the transition to a locked state of the drive frequency can be shortened.

Third Embodiment

Next, the third embodiment of the present invention will be described with reference to FIGS. 13 and 14.

In the third embodiment, the configuration of the harmonics detection circuit 52 of the first and second embodiments is varied, and the configurations of all other elements are the same as in the previous embodiments and descriptions thereof are therefore omitted.

Figure 13:
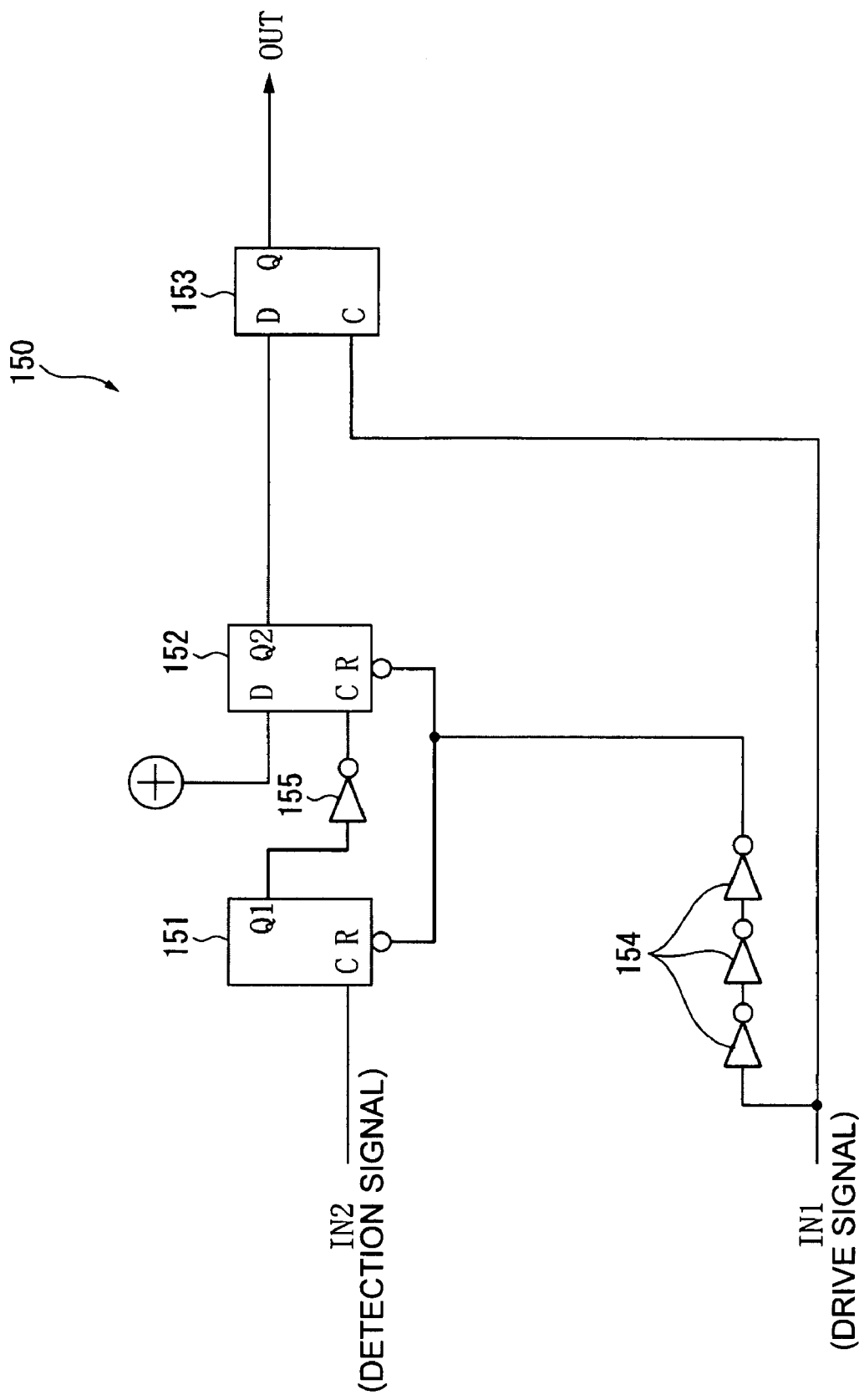
FIG. 13 is a circuit diagram showing the harmonics detection circuit of the second embodiment.

The harmonics detection circuit 150 of the third embodiment includes a counter 151, bistable trigger circuits 152 and 153, and NOT gates 154 and 155, as shown in FIG. 13.

The harmonics detection circuit 150 is configured such that when the detection signal inputted to the input terminal IN2 rises (changes from an L level to an H level) a plurality of times during half a cycle of the drive signal inputted to the input terminal IN 1, or, specifically, while the drive signal is at an L level, the output OUT is at an H level, and at all other times, the output is at an L level.

Figure 14:
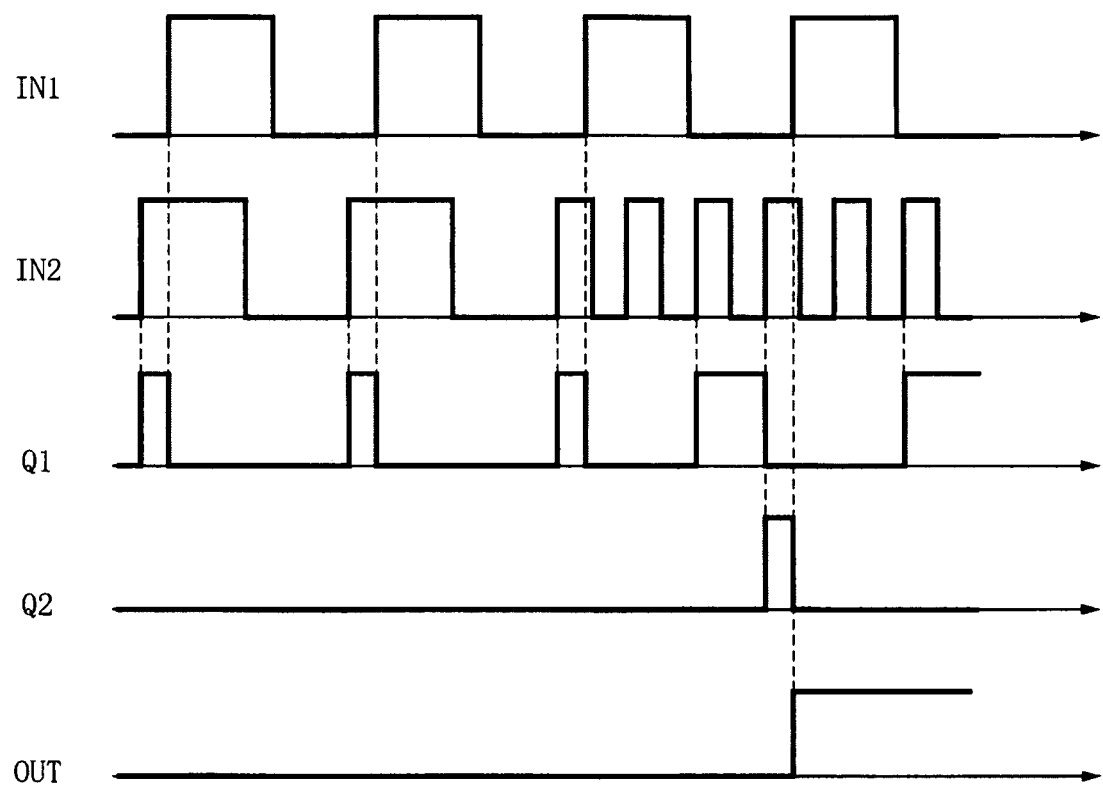
FIG. 14 is a timing chart showing the process of the harmonics detection circuit of the second embodiment.

As shown in the flowchart in FIG. 14, the counter 151 is released from reset when the drive signal inputted to the input terminal IN1 is at an L level, and the output Q1 is changed from an L level to and H level if the detection signal inputted to the input terminal IN2 rises during this resetting. At this time, the clock input of the bistable trigger circuit 152 is changed from an H level to an L level, and the output Q2 therefore remains at an L level and does not change.

Also, the counter 151 and the bistable trigger circuit 152 are both reset when the drive signal inputted to the IN1 reaches an H level, and the output Q1 is therefore varied to an L level, and the output Q2 remains at an L level.

In a state of resonance due to harmonics, the detection signal rises (or falls) a plurality of times within half a cycle of the drive signal. If the detection signal rises twice when the counter 151 is released from reset (within half a cycle of the drive signal), the output Q1 is varied from an L level to an H level with the first rising, and is varied from an H level to an L level with the second rising. The clock input of the bistable trigger circuit 152 is varied from an L level to an H level in accordance with the timing of the second rising, and the output Q2 therefore reaches the data input D, or, in other words, an H level.

At this point, the output Q of the bistable trigger circuit 153 is changed from an L to an H level similar to the bistable trigger circuit 523 in the previous embodiments. Therefore, if the output Q of the bistable trigger circuit 153 is the harmonics detection signal OUT of the harmonics detection circuit 150, then the harmonics detection signal is an H level signal in accordance with the second rising when the detection signal rises twice within half a cycle of the drive signal.

Consequently, a state of resonance due to harmonics can be detected by the harmonics detection circuit 150 of the present embodiment, similar to the harmonics detection circuit 52 of the first and second embodiments, and the same drive frequency control as in the first and second embodiments can be achieved when the harmonics detection circuit 150 is used in place of the harmonics detection circuit 52 of the first and second embodiments.

Therefore, the same operational effects as in the first and second embodiments can be achieved in the third embodiment.

The harmonics detection circuit 150 of the present embodiment has additional effects in that the circuits can be somewhat simpler than the harmonics detection circuit 52, and when the phase difference between the drive signal and the detection signal is small, the possibility that the basic waves of the detection signal will be erroneously detected as harmonics is less than with the harmonics detection circuit 52 of the previous embodiments.

However, the harmonics detection circuit 52 has merits in that when the phase difference between the drive signal and the detection signal is small, the possibility that the harmonics of the detection signal will be erroneously detected as basic waves is less than with the harmonics detection circuit 150 of the present embodiment.

Fourth Embodiment

Next, the fourth embodiment of the present invention will be described with reference to FIGS. 15 and 16.

In the fourth embodiment, the configuration of the harmonics detection circuit 52 of the first and second embodiments is varied, and all other configurations are similar to those in the previous embodiments and descriptions thereof are therefore omitted.

Figure 15:
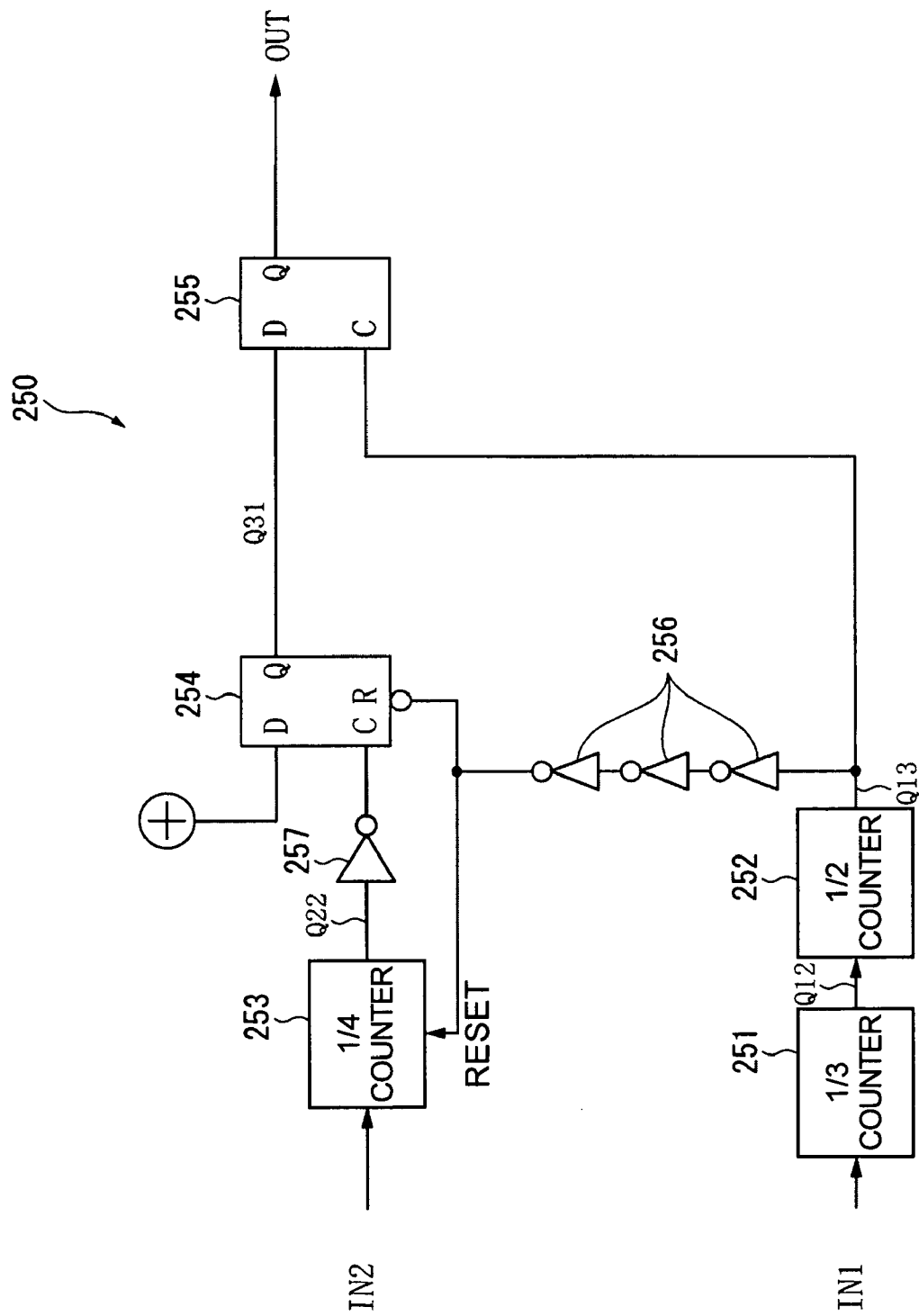
FIG. 15 is a circuit diagram showing the harmonics detection circuit of the third embodiment.

In this example in which n=3, the harmonics detection circuit 250 of the fourth embodiment includes a ⅓ counter 251 as a 1/n counter, a ½ counter 252, a ¼ counter 253 as a 1/(n+1) counter, bistable trigger circuits 254 and 255, and NOT gates 256 and 257, as shown in FIG. 15.

The harmonics detection circuit 250 is configured such that the output OUT is an H level signal, and at all other times the output is an L level signal, when the detection signal inputted to the input terminal IN2 rises or falls n+1 or more times (four or more times, for example), within n cycles (three cycles, for example) of the drive signal inputted to the input terminal IN1.

Figure 16:
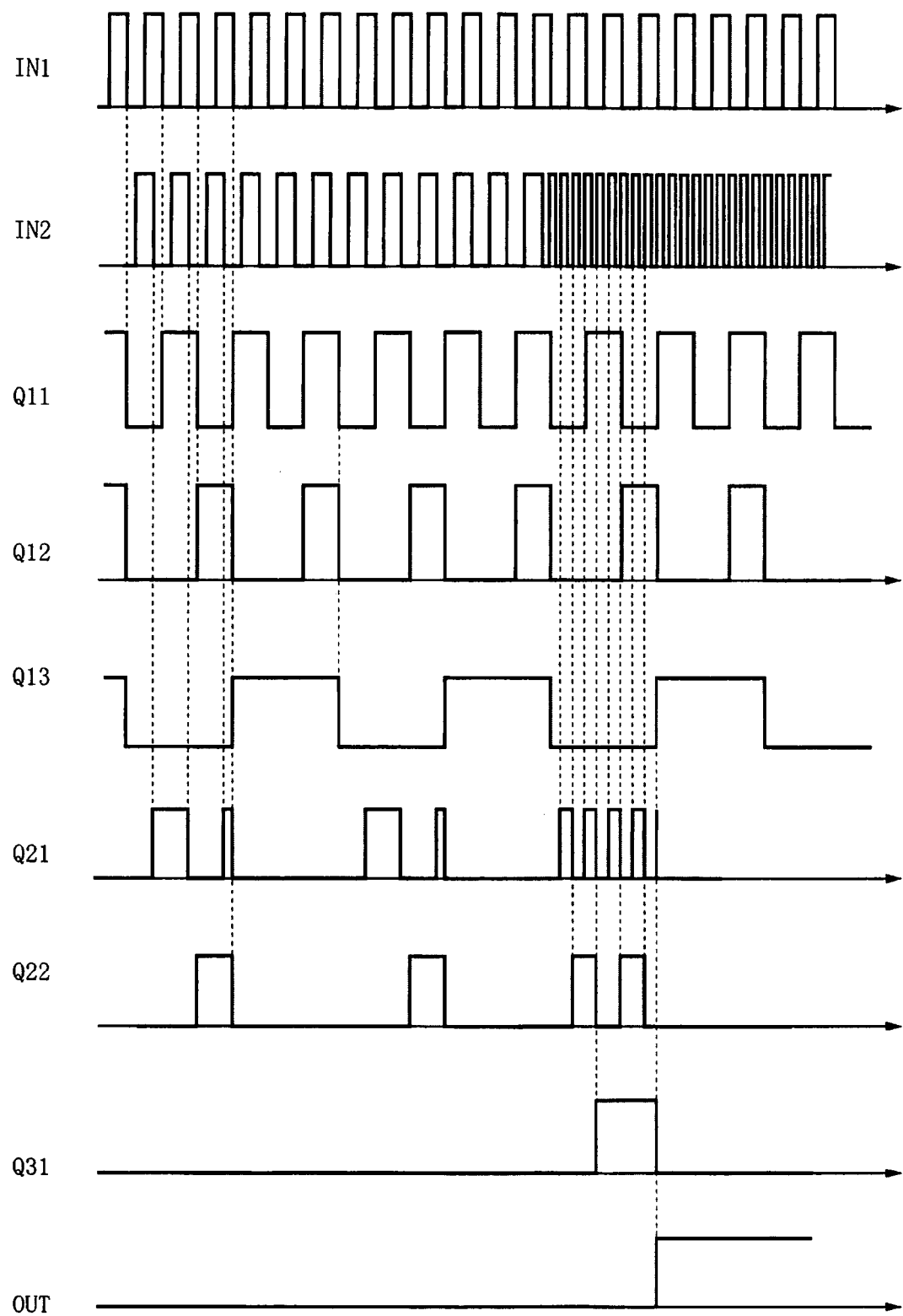
FIG. 16 is a timing chart showing the process of the harmonics detection circuit of the third embodiment.

As shown in the timing chart in FIG. 16, the ⅓ counter 251 divides the drive signal inputted to the IN1 into one cycle in three cycles thereof. Specifically, the input of the IN1 is divided into ½ to obtain Q11, and the output Q11 is used to output Q12 which is divided into ⅓.

The ½ counter 252 divides the drive signal into one cycle in two cycles of the output waveform of Q12 and outputs a signal Q13. As a result, half a cycle of the output Q13 is equivalent to three cycles of the drive signal (IN1).

The output Q13 is inputted to reset terminals of the ¼ counter 253 and the bistable trigger circuit 254 via three NOT gates 256. As a result, the ¼ counter 253 and the bistable trigger circuit 254 are released from reset while Q13 is at an L level.

The ¼ counter 253 divides the detection signal inputted to the IN2 into one cycle within four of its own cycles. Specifically, the detection signal is first divided into ½ into Q21, and this output Q21 is used to output Q22 which is divided into ¼.

The output Q22 of the ¼ counter 253 is inverted by the NOT gate 257 and is inputted to the clock terminal of the bistable trigger circuit 254. In the bistable trigger circuit 254, since an H level signal is inputted to the data input D, an H level signal is outputted from the output Q31 when the clock input changes from an L level to an H level when released from reset.

The reason that the output Q22 changes from an H level to an L level when reset is released is that there are cases in which there is a state of resonance due to harmonics and the detection signal rises four times within half a cycle of Q 13, as shown in FIG. 16. In other words, the output Q31 changes to an H level when the detection signal rises four (=n+1) times within three (=n) cycles of the drive signal.

In the bistable trigger circuit 255, the output Q varies to an H level if the clock input, or Q13, has varied from an L level to an H level when the data input, or Q31, is at an H level. Therefore, if this output Q a harmonics detection signal OUT, an H level signal can be outputted and a state of resonance due to harmonics can be detected when the detection signal rises n+1 times within n cycles of the drive signal.

As a result, a state of resonance due to harmonics can be detected by the harmonics detection circuit 250 of the present embodiment, similar to the harmonics detection circuits 52 and 150 of the previous embodiments, and the same drive frequency control in the first and second embodiments can be achieved when the harmonics detection circuit 250 is used in place of the harmonics detection circuit 52 of the previous embodiments.

Therefore, the same operational effects as in the first and second embodiments can be achieved in the fourth embodiment.

Also, the harmonics detection circuit 250 of the present embodiment measures and determines the fluctuation of the detection signal (the number of times it rises and falls) within n cycles of the drive signal, which the harmonics detection circuits 52 and 150 determine within the time of half a cycle of the drive signal, and can make this determination on the basis of the fluctuation of the detection signal over a longer period of time. Therefore, the possibility that the harmonics will be erroneously detected as basic waves can be less than with the harmonics detection circuits 52 and 150 when the basic waves in the detected waveform have large components when resonated by harmonics, and zero crosses due to harmonics are not likely to occur. The present invention is not limited to the embodiments previously described, and the present invention includes all modifications, improvements, and the like within a range in which the objectives of the present invention can be achieved.

Figure 17:
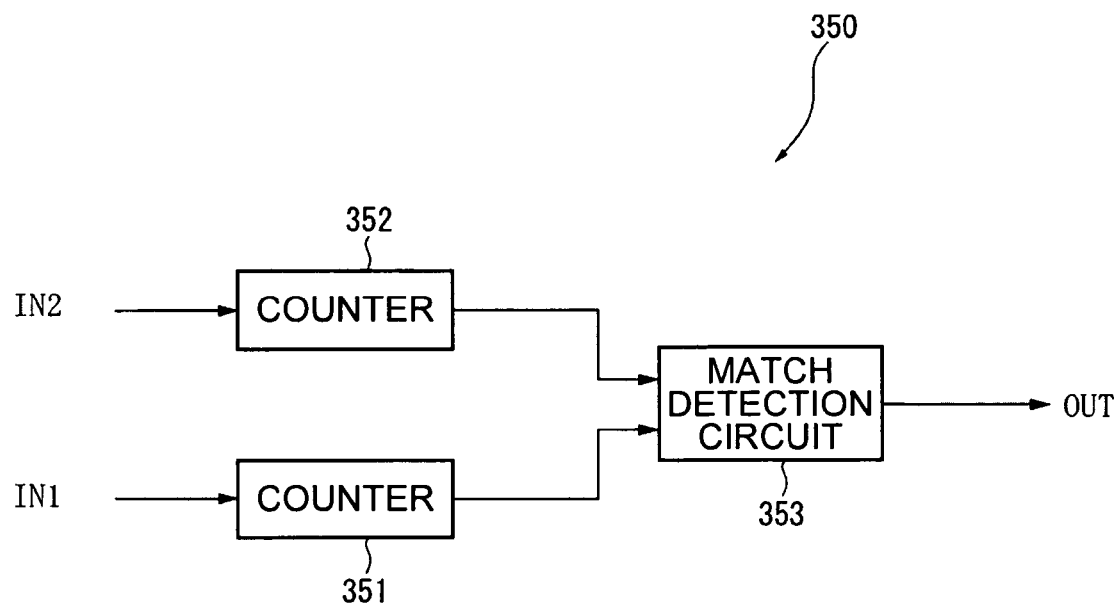
FIG. 17 is a circuit diagram showing a modification of the harmonics detection circuit.

Specifically, the harmonics detection device is not limited to the ones cited in the previous embodiments. A harmonics detection circuit 350, such as the one shown in FIG. 17, for example, may also be used as the harmonics detection device.

The harmonics detection circuit 350 includes counters 351 and 352 for increasing the counter value according to the rising or falling of the drive signal and detection signal, and a match detection circuit 353 for determining whether the counter values of the counters 351 and 352 match.

As a result of such a harmonics detection circuit 350, if the drive signal and the detection signal are signals of the same frequency having a specific phase difference, then the counter values of the counters 351 and 352 match, and if the detection signal is in a state of resonance due to harmonics and the signals have different frequencies, then the counter values of the counters 351 and 352 do not match. Therefore, if the harmonics detection signal OUT of the harmonics detection circuit 350 is at an H level when the counter values are determined by the match detection circuit 353 to not match, and the signal is at an L level when the counter values are determined to match, then a state of resonance due to harmonics can be detected and a harmonics detection signal can be outputted, similar to the harmonics detection circuits 52, 150, and 250 previously described.

The counters 351 and 352 may be reset at intervals of a specific number of drive signal cycles (for example, every 1 to 10 cycles), and whether or not the frequencies of the signals match may be detected each time.

Also, when the frequencies of the signals are to be compared, the frequencies of the signals may be measured and the measured values may be compared without using the counters 351 and 352.

Figure 18:
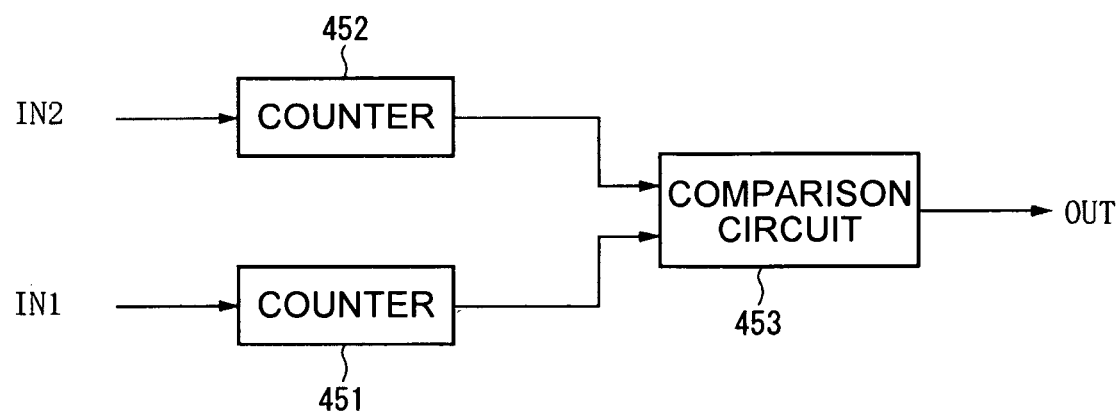
FIG. 18 is a circuit diagram showing another modification of the harmonics detection circuit.
Figure 19:
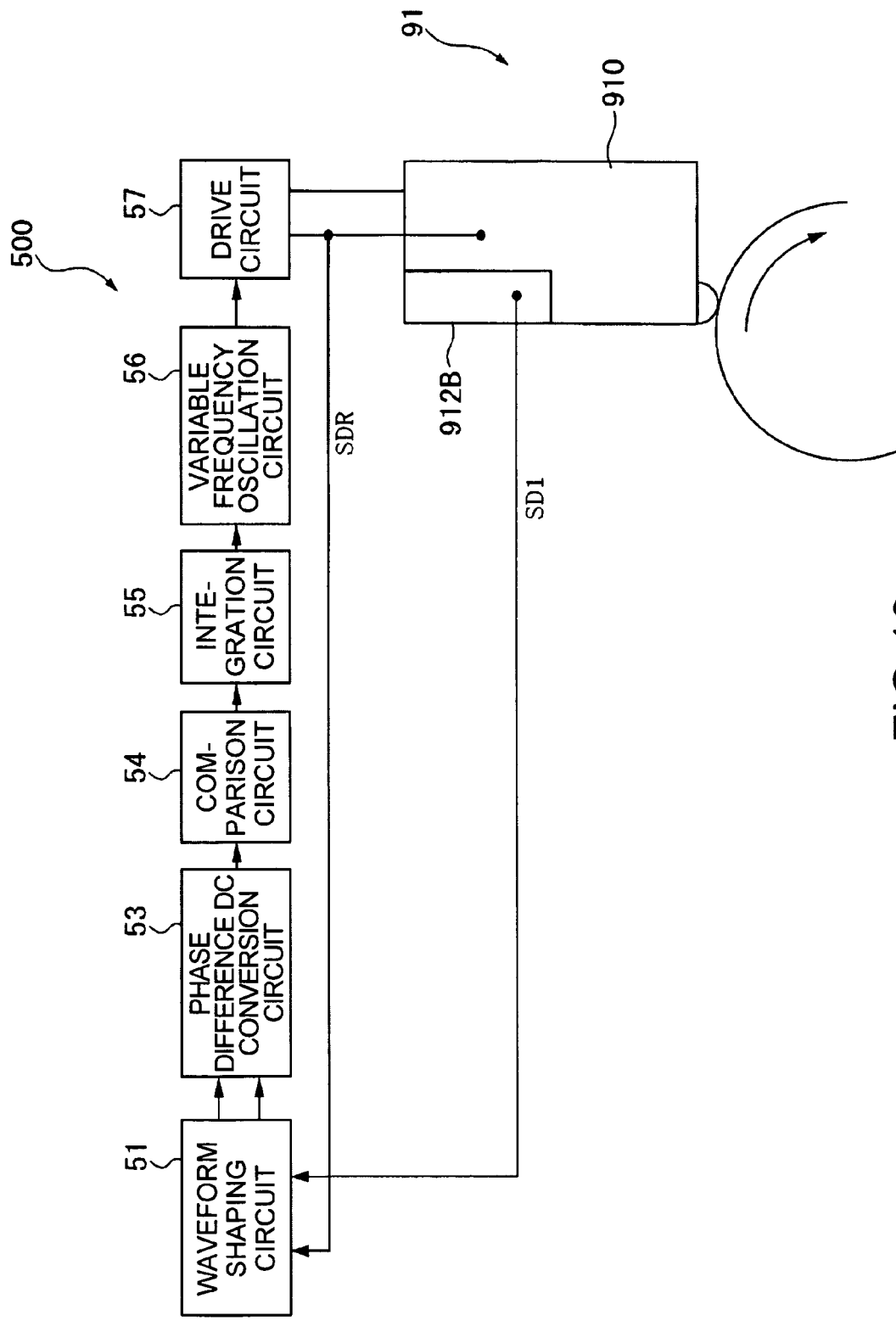
FIG. 19 is a block diagram showing the internal configuration of a conventional drive apparatus for a piezoelectric actuator.
Figure 20:
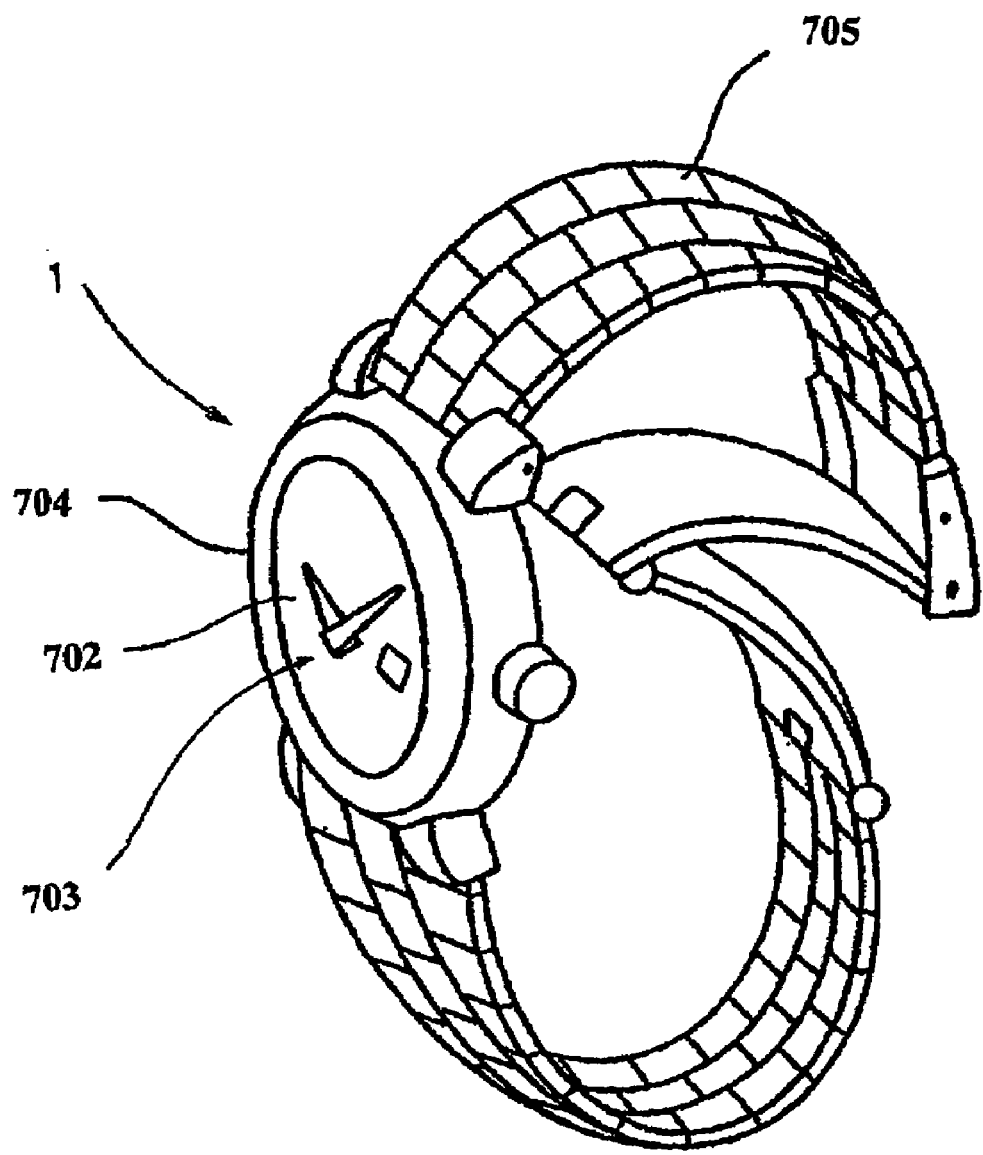
FIG. 20 is a plan view showing the timepiece having the drive apparatus with a band.

A harmonics detection circuit 450 such as the one shown in FIG. 18 may be used as the harmonics detection circuit. The harmonics detection circuit 450 includes counters 451 and 452 for increasing the counter values according to the rising and falling of the drive signal and the detection signal, and a comparison circuit 453 for determining whether the counter value of the counter 452 for counting the detection signal is greater than the counter value of the counter 451 for counting the drive signal.

As a result of the harmonics detection circuit 450, if the output from the comparison circuit 453, or, in other words, the harmonics detection signal OUT of the harmonics detection circuit 450, is at an H level when the frequency of the detection signal is greater than the frequency of the drive signal, and is at an L level at all other times, a state of resonance due to harmonics can be detected and a harmonics detection signal can be outputted, similar to with the harmonics detection circuits previously described.

The counters 451 and 452 may be reset at intervals of specific cycles of the drive signal, and the frequencies of the signals may be compared each time. When the frequencies of the signals are compared, the frequencies of the signals may be measured and the measured values may be compared without using the counters 451 and 452.

Also, in the present invention, the vibrating state detection device for detecting the vibrating state of the vibrating body is not limited to one that detects the vibrating state by detecting the phase difference between the detection signal and the drive signal and comparing this phase difference with a target phase difference, as in the previous embodiments. For example, the vibrating state detection device may be one that is provided with two detection electrodes to the vibrating body and that detects on the basis of the phase difference between the detection signals, one that detects on the basis of the voltage value or the electric current value of the detection signal, or one that detects by comparing the voltage value or electric current value of the detection signal with the voltage value or electric current value of the drive signal. In other words, the vibrating state detection device may be one that detects the vibrating state of the vibrating body in order to control in the increase or decrease in the drive frequency.

Also, the frequency-change-rate change device is not limited to one that detects the amplitude of the detection signal and varies the rate of change in frequency on the basis of the amplitude and of whether or not there is a state of resonance due to harmonics, as in the second embodiment. For example, the frequency-change-rate change device may be one that varies the rate of change in frequency on the basis of only whether or not there is a state of resonance due to harmonics.

Furthermore, the frequency-change-rate change device may detect the phase difference or electric current values of the detection signal and drive signal in stead of detecting the amplitude of the detection signal, and may vary the rate of change in frequency on the basis of these detection results and of whether or not there is a state of resonance due to harmonics.

In other words, the frequency-change-rate change device may be one that detects if the frequency is near the target frequency at which the vibrating body 910 locks, and that can vary the rate of change in frequency to a low speed at such times and can vary the rate of change in frequency to a high speed at all other times.

Also, the frequency-change-rate change device is not limited to one that varies the rate of change in frequency between two levels of a high speed and a low speed, and may be configured to be capable of varying the rate of change among three or more levels according to the vibrating state of the vibrating body 910.

Furthermore, in the previous embodiments, the drive frequency was varied from fmax to fmin, but may conversely also be varied from fmin to fmax.

In the third embodiment, it is determined whether a state of resonance due to harmonics was detected when the detection signal rises n+1 or more times within n cycles of the drive signal, but it may also be determined whether the state of resonance is detected when the detection signal falls n+1 times.

In the second embodiment, it is determined whether a state of resonance due to harmonics was detected when the detection signal rises a plurality of times within half a cycle of the drive signal, but it may also be determined whether the state of resonance is detected when the detection signal falls a plurality of times.

Furthermore, in the first through third embodiments, the cycle of the drive signal or the rising and falling of the detection signal are detected using logical circuits, but the cycle and frequency and the like of the drive signal or detection signal may also be measured and detected based on this data.

Moreover, the drive apparatus of the present invention can be configured in a case 704 with a band 705 connected to the case 704. Therefore, users can wear the drive apparatus.

Also, the devices and the like in the drive apparatus 50 may be configured from various logical elements and other such hardware, and may be configured such that the devices can be achieved by providing a computer with CPU a (central processing unit), memory (storage apparatus), and the like into a timepiece or a portable device, and incorporating a specific program or data (the data stored in the storage unit) into this computer.

The programs and data may be stored in advance in RAM, ROM, or other such memory incorporated into the timepiece or portable device. Also, for example, specific control programs or data may be installed in the timepiece or portable device via the Internet or another such communication device, or a CD-ROM, memory card, or other such storage medium. The devices may be realized by causing the CPU or the like to operate with a program stored in the memory. To install a specific program or the like in the timepiece or portable device, a memory card, CD-ROM, or the like may be directly inserted into the timepiece or portable device, or a device for reading these storage media may be connected to the timepiece or portable device by external mounting. Furthermore, a LAN cable, phone line, or the like may be connected to the timepiece or portable device to load and install a program or the like via wired communication, or the program may be loaded and installed via wireless communication.

If a control program or the like provided by a storage medium, the Internet, or another such communication means is incorporated into the timepiece or portable device, the functions of the present invention can be performed merely by modifying the program, so the control program can be selected and incorporated during factory shipping or as target by the user. In this case, various timepieces and portable devices with different control systems can be manufactured merely by modifying the program, making it possible to share the components and to greatly reduce manufacturing costs when the products are modified.

Also, the present invention is not limited to being applied to the electronic timepiece described in the previous embodiments. Specifically, the drive method for a piezoelectric actuator according to the present invention or the electronic timepiece that employs the drive apparatus is not limited to a wristwatch, standing timepiece, wall timepiece, or other such electronic timepieces, and the present invention can be applied to various electronic devices and is particularly suitable for portable electronic devices for which compactness is a requirement. Examples of such electronic devices include phones, portable phones, personal computers, portable information terminals (PDA), cameras, and other devices with timepiece functions. The present invention can also be applied to film cameras, digital cameras, video cameras, portable phones with camera functions, and other such electronic devices that do not have a timepiece function. When the present invention is applied to electronic devices with a camera function, the drive device of the present invention can be used to drive a focusing mechanism, a zoom mechanism, a lens adjusting mechanism, or the like (driven body). Furthermore, the drive device of the present invention may also be used in a drive mechanism for a meter pointer in a measurement device, a drive mechanism in a mobile toy, a drive mechanism for a meter pointer in an instrument panel in an automobile or the like, a piezoelectric buzzer, a printer inkjet head, an ultrasonic motor, or the like.

Also, a piezoelectric actuator was used to drive the date display mechanism of the electronic timepiece 1 in the first embodiment, but the actuator not limited to this option alone and may also be used to drive time display hands (pointers) in the electronic timepiece 1. Thus, replacing the stepping motor normally used to drive the pointers with a piezoelectric actuator allows the electronic timepiece 1 to be designed as a single thin layer and to be made highly antimagnetic because the piezoelectric actuator is less susceptible to magnetism than the stepping motor.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application Nos. 2004-325366 and 2004-067562. The entire disclosure of Japanese Patent Application Nos. 2004-325366 and 2004-067562 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

[Key]

1 . . . electronic timepiece, 50 . . . drive apparatus, 51 . . . waveform shaping circuit, 52 . . . harmonics detection circuit, 53 . . . phase difference-DC conversion circuit, 54 . . . comparison circuit, 55 . . . integration circuit, 56 . . . variable frequency oscillation circuit, 57 . . . drive circuit, 58 . . . amplitude detection circuit, 59 . . . clock control circuit, 61 . . . oscillation circuit, 62 . . . divider circuit, 64 . . . clock selection circuit, 74 . . . up/down counter, 75 . . . D/A converter, 90 . . . date display mechanism (driven body), 91 . . . piezoelectric actuator, 150 . . . harmonics detection circuit, 151 . . . counter, 152, 153 . . . bistable trigger circuits, 250 . . . harmonics detection circuit, 251 . . . ⅓ counter, 253 . . . ¼ counter, 254, 255 . . . bistable trigger circuits, 350 . . . harmonics detection circuit, 351, 352 . . . counters, 353 . . . match detection circuit, 450 . . . harmonics detection circuit, 451, 452 . . . counters, 453 . . . comparison circuit, 702 generator, 703 time indicating part, 704 case, 705 band, 910 . . . vibrating body, 912 . . . piezoelectric element, 912A . . . drive electrode, 912B . . . detection electrode, 914 . . . convexities.

What is claimed is:

1. A drive apparatus for a piezoelectric actuator having a piezoelectric element being configured to vibrate by application of a drive signal with a specific frequency, said drive apparatus comprising:

vibration state detection means for detecting a vibrating state of said piezoelectric element and for outputting a detection signal;

harmonics detection means for detecting resonating of said piezoelectric element due to harmonics of said drive signal and for outputting a harmonics detection signal; and frequency control means for supplying said drive signal to said piezoelectric element while controlling said frequency of said drive signal, for controlling said frequency of said drive signal based on said detection signal when said harmonics detection is not outputted from said harmonics detection means, and for controlling said frequency of said drive signal based apart from said detection signal when said harmonics detection is outputted apart from said harmonics detection means.

2. The drive apparatus according to claim 1, wherein said vibration state detection means detects a phase difference between said detection signal and said drive signal, outputs a first detection signal when said phase difference is equal to or greater than a predetermined target value, and outputs a second signal when said phase difference is smaller than said predetermined target value, said frequency control means changes said frequency of said drive signal within a predetermined range, changes said frequency from one of either the maximum frequency or the minimum frequency of said range in a first direction towards the other; maintains changing said frequency in said first direction when said harmonics detection signal is not detected and said first detection signal is detected, changes said frequency in a second direction opposite to said first direction when said harmonics detection signal is not outputted and said first detection signal or said second detection signal is detected, and maintains changing said frequency in said first direction when said harmonics detection signal is outputted.

3. The drive apparatus according to claim 1, wherein said vibration state detection means has phase difference-DC conversion means for outputting a phase difference signal based on phase difference between said detection signal and said drive signal, and comparison means for comparing voltage of said phase difference signal and voltage based on predetermined target phase difference, and for outputting comparison information.

4. The drive apparatus according to claim 2, wherein said frequency control means has frequency-change-rate change means for changing rate of change in drive frequency, which is an amount of change in said drive frequency per unit time.

5. The drive apparatus according to claim 4, wherein said frequency-change-rate change means for determining whether said rate of change is larger when said harmonics detection signal is detected than when said harmonics detection signal is not detected.

6. The drive apparatus according to claim 4, wherein said frequency-change-rate change means has amplitude detection means for detecting whether an amplitude of said detection signal is equal to or greater than a specific value and outputting an amplitude detection signal, said frequency-change-rate change means for determining said rate of change smaller when said harmonics detection signal is not outputted and said amplitude detection signal is outputted.

7. The drive apparatus according to claim 1, wherein said harmonics detection means outputs said harmonics detection signal when said detection signal both rises and falls within half a cycle of said drive signal.

8. The drive apparatus according to claim 1, wherein said harmonics detection means outputs said harmonics detection signal when said detection signal rises or falls a plurality of times within half a cycle of said drive signal.

9. The drive apparatus according to claim 1, wherein said harmonics detection means outputs said harmonics detection signal when said detection signal rises or falls n+1 number of times or more within n cycles of said drive signal, n being a natural number.

10. The drive apparatus according to claim 1, wherein said harmonics detection means outputs said harmonics detection signal when said frequency of said drive signal and said frequency of said detection signal do not match.

11. The drive apparatus according to claim 1, wherein
said harmonics detection means outputs said harmonics detection signal when said frequency of said detection signal is greater than said frequency of said drive signal.

12. A drive method for driving a piezoelectric actuator having a piezoelectric element vibrating by application of a drive signal with a specific frequency, said drive method comprising:
detecting a vibrating state of said piezoelectric element;
outputting a detection signal;
detecting resonance of said piezoelectric element due to harmonics of said drive signal;
outputting a harmonics detection signal;
supplying said drive signal to said piezoelectric element while controlling said frequency of said drive signal;
controlling said frequency of said drive signal based on said detection signal when said harmonics detection signal is not outputted from said outputting said harmonics signal and said frequency of said drive signal not based on said detection signal when said harmonics detection signal is outputted from said outputting said harmonics signal.

13. The drive method according to claim 12, wherein
said detecting said vibration state includes detecting a phase difference between said detection signal and said drive signal,
said outputting said detection signal includes outputting a first detection signal when said phase difference is equal to or greater than a predetermined target value and a second detection signal when said phase difference is smaller than said predetermined target value,
said controlling said frequency includes changing said frequency of said drive signal within a predetermined range, changing said frequency from one of either the maximum frequency or the minimum frequency of said range in a first direction towards the other, maintaining changing said frequency in said first direction when said harmonics detection signal is not detected and said first detection signal is detected, changing said frequency in a second direction opposite to said first direction when said harmonics detection signal is not outputted and said first detection signal or said second detection signal is detected, and maintaining changing said frequency in said first direction when said harmonics detection signal is outputted.

14. The drive method according to claim 13, wherein
said controlling said frequency includes changing a rate of change in drive frequency, which is an amount of change in said drive frequency per unit time.

15. The drive method according to claim 14, wherein
said changing said rate of change includes determining whether said rate of change is larger when said harmonics detection signal is detected than when said harmonics detection signal is not detected.

16. The drive method according to claim 14, wherein
said changing said rate of change includes detecting whether an amplitude of said detection signal is equal to or greater than a specific value, outputting an amplitude detection signal, and determining whether said rate of change is smaller when said harmonics detection signal is not outputted and said amplitude detection signal is outputted.

17. An electric device comprising:
a driven body; and
a drive apparatus having a piezoelectric actuator having a piezoelectric element being configured to vibrate by application of a drive signal having a specific frequency being applied, said drive apparatus having
vibration state detection means for detecting a vibrating state of said piezoelectric element and for outputting a detection signal,
harmonics detection means for detecting resonance of said piezoelectric element due to harmonics of said drive signal and to output a harmonics detection signal, and
frequency control means for supplying said drive signal to said piezoelectric element while controlling said frequency of said drive signal, for controlling said frequency of said drive signal based on said detection signal when said harmonics detection is not outputted from said harmonics detection means, and for controlling said frequency of said drive signal not based on said detection signal when said harmonics detection is outputted from said harmonics detection means.

18. The electric device according to claim 17, wherein said driven body displays date information.

19. The electric device according to claim 17, further comprising
a generator, and
a battery being connected to said generator and arranged to supply power to said piezoelectric actuator.

20. The electric device according to claim 17, further comprising
a case housing said vibration state detection means, said harmonics detection means, and said frequency control means, and
a time indicating part being configured in said case showing time information.

21. The electric device according to claim 20, further comprising
a band being connected to said case in order to be worn on a human body.

22. An electric device comprising:
a driven body; and
a drive apparatus having a piezoelectric actuator having a piezoelectric element being configured to vibrate by application of a drive signal having a specific frequency being applied, said drive apparatus having
a vibrating state detection device being configured to detect a vibrating state of said piezoelectric element and to output a detection signal,
a harmonics detection circuit being configured to detect resonance of said piezoelectric element due to harmonics of said drive signal and to output a harmonics detection signal, and
a frequency control device being configured to supply said drive signal to said piezoelectric element while controlling said frequency of said drive signal, to control said frequency of said drive signal based on said detection signal when said harmonics detection is not outputted from said harmonics detection circuit, and to control said frequency of said drive signal not based on said detection signal when said harmonics detection is outputted from said harmonics detection circuit.

23. The electric device according to claim 22, wherein said driven body displays date information.

* * * * *